(12) United States Patent
Kobayashi et al.

(10) Patent No.: US 9,639,227 B2
(45) Date of Patent: May 2, 2017

(54) ELECTROCONDUCTIVE LAMINATE AND TOUCH PANEL USING THEREOF

(71) Applicants: NIPPON PAINT AUTOMOTIVE COATINGS CO., LTD., Osaka (JP); TEIJIN LIMITED, Osaka (JP)

(72) Inventors: Kazuhito Kobayashi, Osaka (JP); Yusuke Nakata, Osaka (JP); Koichi Imamura, Tokyo (JP); Atsushi Sasaki, Tokyo (JP)

(73) Assignees: NIPPON AUTOMOTIVE COATINGS CO., LTD., Osaka (JP); TEIJIN LIMITED, Osaka (JP)

( * ) Notice: Subject to any disclaimer, the term of this patent is extended or adjusted under 35 U.S.C. 154(b) by 0 days.

(21) Appl. No.: 15/023,432

(22) PCT Filed: Sep. 29, 2014

(86) PCT No.: PCT/JP2014/075915
§ 371 (c)(1),
(2) Date: Mar. 21, 2016

(87) PCT Pub. No.: WO2015/046519
PCT Pub. Date: Apr. 2, 2015

(65) Prior Publication Data
US 2016/0216804 A1    Jul. 28, 2016

(30) Foreign Application Priority Data
Sep. 30, 2013   (JP) .................................. 2013-204943

(51) Int. Cl.
*G06F 3/044* (2006.01)
*B05D 5/06* (2006.01)
(Continued)

(52) U.S. Cl.
CPC ............. *G06F 3/044* (2013.01); *B05D 5/063* (2013.01); *B05D 7/04* (2013.01); *B32B 27/08* (2013.01);
(Continued)

(58) Field of Classification Search
CPC ........... G06F 3/044; G06F 2203/04103; B05D 5/063; B05D 7/04; C09D 133/14
(Continued)

(56) References Cited

U.S. PATENT DOCUMENTS

2014/0340741 A1* 11/2014 Adachi ................... B32B 15/08
359/360
2015/0049261 A1    2/2015 Kobayashi et al.
(Continued)

FOREIGN PATENT DOCUMENTS

JP        1-269258       10/1989
JP       2013-73851      4/2013
(Continued)

OTHER PUBLICATIONS

International Search Report issued Oct. 28, 2014 in International Application No. PCT/JP2014/075915.
(Continued)

*Primary Examiner* — Tahseen N Khan
(74) *Attorney, Agent, or Firm* — Wenderoth, Lind & Ponack, L.L.P.

(57) ABSTRACT

The electroconductive laminate according to the present invention is obtained by laminating a hard coat layer and an electrically conducting layer on at least one surface of a polycarbonate base. This electroconductive laminate is characterized in that the hard coat layer is formed from a hard coating composition which contains (A) a phenolic novolac acrylate having two or more acrylate groups, (B) an ortho-phenyl phenol acrylate containing 1-2 mol of an ethylene
(Continued)

oxide structure in each molecule and (C) a bisphenol skeleton-containing diacrylate containing 2-4 mol of an alkylene oxide structure having two or three carbon atoms in each molecule.

12 Claims, 2 Drawing Sheets

(51) Int. Cl.
    B05D 7/04      (2006.01)
    C09D 133/14    (2006.01)
    B32B 27/36     (2006.01)
    G06F 3/041     (2006.01)
    C23C 14/08     (2006.01)
    B32B 27/08     (2006.01)
    B32B 27/20     (2006.01)
    G06F 3/045     (2006.01)

(52) U.S. Cl.
    CPC .............. *B32B 27/20* (2013.01); *B32B 27/36* (2013.01); *B32B 27/365* (2013.01); *C09D 133/14* (2013.01); *C23C 14/086* (2013.01); *G06F 3/041* (2013.01); *G06F 3/045* (2013.01); *B32B 2255/10* (2013.01); *B32B 2255/26* (2013.01); *B32B 2264/102* (2013.01); *B32B 2307/202* (2013.01); *B32B 2307/412* (2013.01); *B32B 2307/418* (2013.01); *B32B 2307/536* (2013.01); *B32B 2457/00* (2013.01); *B32B 2457/208* (2013.01); *G06F 2203/04103* (2013.01)

(58) Field of Classification Search
    USPC ......................................................... 428/220
    See application file for complete search history.

(56)         References Cited

U.S. PATENT DOCUMENTS

2015/0275028 A1*  10/2015  Tamura ................. B05D 3/007
                                                      427/386
2016/0239122 A1*   8/2016  Imamura ................ G06F 3/044

FOREIGN PATENT DOCUMENTS

JP        2013-180556       9/2013
JP        2013-209481      10/2013
JP        2013-209842      10/2013

OTHER PUBLICATIONS

International Preliminary Report on Patentability issued Apr. 5, 2016 in International Application No. PCT/JP2014/075915.

* cited by examiner

ELECTROCONDUCTIVE LAMINATE AND TOUCH PANEL USING THEREOF

TECHNICAL FIELD

The present invention relates to an electroconductive laminate in which a hard coat layer and an electrically conducting layer are formed on at least one surface of a polycarbonate substrate, in particular, an electroconductive laminate having a hard coat layer that has stretchability in addition to high visibility and excellent hardness, while exhibiting excellent adhesion toward a polycarbonate substrate, and a touch panel using thereof.

BACKGROUND OF THE INVENTION

A liquid crystal display device has advantages such as thinness, lightweight, low power consumption and so on, and is widely used in various technical fields such as computers, word processors, television sets, mobile phones, handheld terminal devices and so on. In addition, so-called touch panels of such liquid crystal display devices having a mechanics of manipulation by touch on their screen are spreading rapidly. The touch panels are widely used in mobile phones like smart phones, tablet computers, handheld terminal devices, automated teller machines, automatic vending machines, personal digital assistances, copying machines, facsimiles, game machines, guiding devices set up in facilities such as museums and department stores, car navigation systems, multifunctional terminals set up in convenience stores or monitoring devices of railroad vehicles.

The touch panel generally has a transparent electroconductive laminate comprising a transparent substrate on which a transparent electrically conductive layer is formed. Indium tin oxide is generally used to form a transparent electrically conducting layer.

A PET film or a polycarbonate film is commonly used as a substrate film of a transparent electroconductive laminate thanks to its high transparency and reasonable prices. A transparent hard coat layer can be preferably applied onto such a substrate film with a view to improving scratch resistance and durability. On the other hand, the application of a transparent hard coat layer onto a substrate causes a problem of the appearance of interference fringes. The appearance of interference fringes deteriorates visibility.

As for the appearance of interference fringes, the inventors et al., have already found a hard coating composition in the patent application No. JP 2012-079755 or JP 2012-079756, which solves the problem by providing a layer having a refractive index close to a refractive index of a polycarbonate substrate. The above two patent applications were unpublished applications at the time of filing the earlier application given as the basis for the priority. On the other hand, the hard coating composition in the above two patent applications has required further improvements.

A polycarbonate substrate is frequently stored once in the state of forming a hard coat layer and an optional electrically conducting layer. In that case, the hard coat layer or the electrically conducting layer is protected by a protection film thereon and is stored. After stored, the protection film is stripped from it and the substrate is used. When the protection film is stripped, mere stripping of the protection film is desired. In fact, however, the hard coat layer and/or other layers may be stripped together from the substrate when the protection film is stripped, by adhesion of the layer(s) to the protection film. The appearance is not properly desired, and improvement is required.

PRIOR ART DOCUMENTS

Patent Documents

Patent Document 1: JP patent application No. 2012-079755 (JP 2013-209481 A)
Patent Document 2: JP patent application No. 2012-079756 (JP 2013-209482 A)

SUMMARY OF THE INVENTION

Problems to be Resolved by the Invention

The present invention has an object to resolve the above problems in the conventional technology. In details, the present invention has an object to improve adhesion between a hard coat layer and a polycarbonate substrate in an electroconductive laminate having a hard coat layer which the inventors et al, have been developed.

Means of Solving the Problems

The present invention provides the following embodiments, to solves the above problems.

[1]
The present invention relates to an electroconductive laminate in which a hard coat layer and an electrically conducting layer are formed on at least one surface of a polycarbonate substrate, wherein
  the hard coat layer is obtained by a hard coating composition comprising
(A) a phenolic novolac acrylate having two or more acrylate groups,
(B) an orthophenyl phenol acrylate having 1 or 2 mols of an ethylene oxide structure in each molecule, and
(C) a bisphenol structure-containing diacrylate having 2 to 4 moles of alkylene oxide structure with two or three carbon atoms in each molecule, wherein
  the hard coating composition comprises
40 to 50 parts by mass of the phenolic novolac acrylate (A),
  25 to 35 parts by mass of the orthophenyl phenol acrylate (B), and
10 to 20 parts by mass of the diacrylate (C), with respect to 100 parts by mass of a resin content in the hard coating composition. Thereby, the above problem is solved.
[2]
The phenolic novolac acrylate (A) may preferably be represented by the following formula (I):

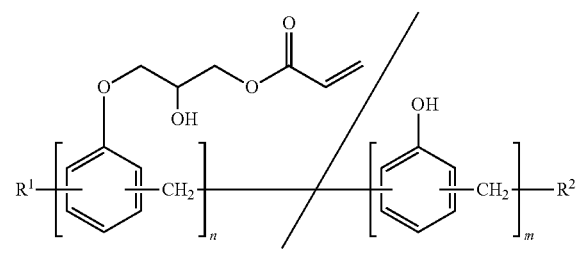

wherein $R^1$ represents H or $CH_2OH$, $R^2$ represents H or OH, n represents a number of 2 to 5 and m represents a number of 0 to 5.

[3]
The hard coat layer may preferably have a refractive index within a range of 1.565 to 1.575.

[4]
A total content of ZnO, $TiO_2$, $CeO_2$, $SnO_2$, $ZrO_2$ and indium tin oxide in the hard coat layer may preferably be less than or equal to 0.0001% by mass.

[5]
The electrically conducting layer may preferably have a thickness within a range of 5 to 100 nm.

[6]
The present invention also provides an electroconductive laminate in which a hard coat layer, a color difference adjusting layer, and an electrically conducting layer are formed on at least one surface of a polycarbonate substrate, wherein
the hard coat layer is obtained by a hard coating composition comprising
(A) a phenolic novolac acrylate having two or more acrylate groups,
(B) an orthophenyl phenol acrylate having 1 or 2 mols of an ethylene oxide structure in each molecule, and
(C) a bisphenol structure-containing diacrylate having 2 to 4 moles of alkylene oxide structure with two or three carbon atoms in each molecule, wherein
the hard coating composition comprises
40 to 50 parts by mass of the phenolic novolac acrylate (A),
25 to 35 parts by mass of the orthophenyl phenol acrylate (B), and
10 to 20 parts by mass of the diacrylate (C), with respect to 100 parts by mass of a resin content in the hard coating composition, and wherein
the color difference adjusting layer is obtained by a composition comprising a curing resin component (i), and metal oxide particles having an average primary particle diameter of 100 nm or less (ii) and/or metal fluoride particles having an average primary particle diameter of 100 nm or less (iii), and
where a total mass of the particles (ii) and (iii) in the color difference adjusting layer is 0-200 parts by mass with respect to 100 parts by mass of the curing resin component (i), and wherein
a difference $\Delta R$ of R1 and R2 is not greater than 1, wherein R1 is a reflectance obtained by irradiation with a light source having a wavelength in a range of 500 to 750 nm toward the transparent electroconductive laminate, and R2 is a reflectance obtained by irradiation with a light source having a wavelength in a range of 500 to 750 nm toward a transparent electroconductive laminate after immersion into a strong acid aqueous solution at 40° C. for three minutes and dried, wherein the strong acid aqueous solution is obtained by a mixing of 12 N hydrochloric acid, 16 N nitric acid and water in a mass ratio of 12 N hydrochloric acid:16 N nitric acid:water being 3.3:1.0:7.6.

[7]
In the electroconductive laminate, an auxiliary electrode layer may preferably be formed on the electrically conducting layer, wherein a total thickness of the electrically conducting layer and the auxiliary electrode layer is within a range of 20 to 500 nm.

[8]
In the electroconductive laminate, an antiblocking layer may preferably be formed on the other side of the hard coat layer side of the polycarbonate substrate, wherein
the antiblocking layer is obtained by a composition for forming an antiblocking layer comprising a first component and a second component, wherein the first component is an unsaturated double bond containing acrylic copolymer, and the second component comprises a polyfunctional acrylate, and
a difference of SP values ($\Delta SP$) of the first component (SP1) and the second component (SP2) is within a range of 1 to 2, and
phase separation occurs between the first component and the second component after the composition for forming an antiblocking layer is applied, to form an antiblocking layer having a microscopic convexoconcave on its surface.

[9]
The present invention also provides a touch panel having the above-mentioned electroconductive laminate.

Advantageous Effect of the Invention

The electroconductive laminate according to the present invention has a hard coat layer obtained by applying a specific hard coating composition onto a polycarbonate substrate. The hard coat layer according to the present invention has features of excellent hardness, high visibility and stretchability. The hard coat layer according to the present invention also has a high refractive index. Therefore, the present invention has an advantageousness without interference fringes in case that the hard coat layer according to the present invention is applied onto a high refractive index substrate film such as a polycarbonate film.

A resin components contained in the hard coating composition according to the present invention also has a technical characteristic of providing a high refractive index, even if the hard coating composition does not substantially include high refractive index materials such as metal oxide. The hard coat layer according to the present invention also has features of excellent stretchability, in addition to excellent hardness and high refractive index.

The hard coating composition which provides the hard coat layer according to the present invention contains a bisphenol structure-containing diacrylate (C), which provides excellent wettability toward a polycarbonate substrate having similar bisphenol structure. In addition, the hard coating composition has features of excellent adhesion such that an orthophenyl phenol acrylate (B) enters into a surface of a polycarbonate substrate.

There is an advantage in use of the hard coating composition to provide a hard coat layer that has stretchability in addition to high visibility and excellent hardness, while exhibiting excellent adhesion toward a polycarbonate substrate, when a transparent hard coat layer is formed on a substrate film having high refractive index such as a polycarbonate film.

DETAILED DESCRIPTION OF THE PREFERRED EMBODIMENTS

Figure 1:
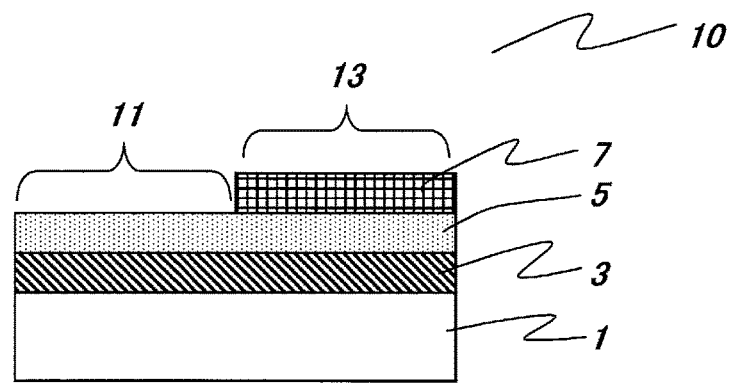
FIG. 1 is a schematic explanatory view showing a transparent electroconductive laminate subjected to an etching treatment.

The electroconductive laminate according to the present invention is an electroconductive laminate in which a hard coat layer, a color difference adjusting layer and an electrically conducting layer are formed on at least one surface of a polycarbonate substrate. The present invention includes an embodiment without a color difference adjusting layer. However, the present specification describes an embodiment with a color difference adjusting layer in view of conveniences. Also, an order of the layers according to the present invention is not limited in the above-mentioned order. However, the present specification describes the above-mentioned order in view of simplification of explanation. Furthermore, in many cases, the electroconductive laminate according to the present invention seems to be basically used as a transparent electroconductive laminate. However, an embodiment of the electroconductive laminate according to the present invention is not limited to a transparent electroconductive laminate. Therefore, the electroconductive laminate according to the present invention includes an embodiment having an opaque electrically conducting layer. Each layers constituting the electroconductive laminate according to the present invention is explained below.

Polycarbonate Substrate

A polycarbonate substrate used in the electroconductive laminate according to the present invention is generally a transparent substrate. However, a polycarbonate substrate is not necessarily a transparent because the electroconductive laminate according to the present invention is not limited to a transparent electroconductive laminate described above. In case that a polycarbonate substrate is a transparent, a substrate having less optical birefringence, a substrate having controlled phase difference such as one out of four (1/4) of a wavelength such as 550 nm, i.e., λ/4, or one out of two (1/2) of a wavelength, i.e., λ/2, or a substrate without controlled birefringence of the transparent polymer substrates can be selected in view of its use. The selection in view of its use includes, for example, using the transparent electroconductive laminate according to the present invention with a display which expresses a function by polarization such as linearly polarization, elliptic polarization or circular polarization, specifically, for example, a polarizing plate or a phase difference film used in a liquid-crystal display, and an inner-type touch panel.

A refractive index of a polycarbonate substrate may vary depending on its component monomer, and is generally in a range of about not less than 1.5 and less than 1.6. A phase difference R(550) of a polycarbonate film may preferably be in a range of 0 to 160 nm. A polycarbonate film may preferably satisfy the following formulae (1) and (2):

$$0.60 < R(450)/R(550) < 1.20 \quad (1)$$

$$0.80 < R(650)/R(550) < 1.40 \quad (2)$$

(provided that R(450), R(550) and R(650) mean a phase difference in a film surface at a wavelength of 450 nm, 550 nm and 650 nm, respectively.) A refractive index of a polycarbonate substrate may more preferably be in a range of not less than 1.56 and less than 1.60. Most preferably, a polycarbonate film may has a refractive index of not less than 1.57 and less than 1.59, a phase difference R(550) of 0 to 10 nm and satisfy the following formulae (3) and (4):

$$1.01 < R(450)/R(550) < 1.20 \quad (3)$$

$$0.80 < R(650)/R(550) < 0.99 \quad (4)$$

A thickness of a polycarbonate substrate can be appropriately selected. The thickness may be 10 to 500 μm in view of its strength or handling property, preferably 20 to 300 μm, more preferably 30 to 200 μm.

Hard coat layer

The hard coat layer in the electroconductive laminate according to the present invention is obtained by applying and curing a hard coating composition containing (A) a phenolic novolac acrylate having two or more acrylate groups,
(B) an orthophenyl phenol acrylate having 1 or 2 mols of an ethylene oxide structure in each molecule, and
(C) a bisphenol structure-containing diacrylate having 2 to 4 moles of alkylene oxide structure with two or three carbon atoms in each molecule.

In the present invention, the hard coating composition necessarily contains 40 to 50 parts by mass of the phenolic novolac acrylate (A),
25 to 35 parts by mass of the orthophenyl phenol acrylate (B), and
10 to 20 parts by mass of the diacrylate (C), with respect to 100 parts by mass of a resin content in the hard coating composition.

(A) a Phenolic Novolac Acrylate Having Two or More Acrylate Groups

The hard coating composition contains (A) a phenolic novolac acrylate having two or more acrylate groups. The hard coating composition containing the phenolic novolac acrylate (A) can provide a high refractive index hard coat layer with transparency and excellent hardness. The technical feature can effectively prevent appearance of interference fringes.

The phenolic novolac acrylate (A) may preferably be represented by the following formula (I):

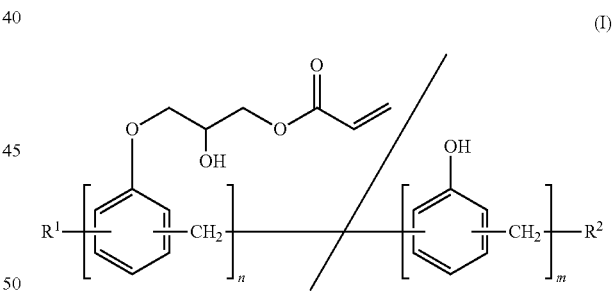

(I)

wherein $R^1$ represents H or $CH_2OH$, $R^2$ represents H or OH, n represents a number of 2 to 5 and m represents a number of 0 to 5.

In the above formula (I), n may preferably represent a number of 2 to 4 and m may preferably represent a number of 0 to 3, more preferably n may represent a number of 2 to 4 and m may represent a number of 0 to 1.

The phenolic novolac acrylate (A) may preferably have a weight average molecular weight of 400 to 2500, more preferably 450 to 2000. The phenolic novolac acrylate (A) may preferably have a hydroxyl value of 100 to 180 mgKOH/g, more preferably 120 to 160 mgKOH/g.

In this specification, weight average molecular weights of various components can be measured by gel permeation chromatography (GPC). In a measurement of weight average molecular weights, a high performance gel permeation chromatography apparatus such as HLC-8220GPC (manufactured by Tosoh Corporation) can be used. A concrete measurement condition of weight average molecular weights in use of HLC-8220GPC (manufactured by Tosoh Corporation) is, for example, measuring a test sample (2 g), drying the test sample in a vacuum dryer at 40° C. for 2 hours to remove a water, diluting the sample by THF solution in a concentration of 0.2%, then measuring under the following conditions: column injection amount of 10 μl, flow late of 0.35 ml/min.

The hard coating composition comprises 40 to 50 parts by mass of the phenolic novolac acrylate (A) providing that 100 parts by mass of a resin content in the hard coating composition. When an amount of the phenolic novolac acrylate (A) is less than 40 parts by mass, a hardness of the resulting hard coat layer is lowered. When an amount of the phenolic novolac acrylate (A) is more than 50 parts by mass, adhesion property toward a transparent polymer substrate such as a polycarbonate film lowers.

(B) an Orthophenyl Phenol Acrylate Having 1 or 2 mols of an Ethylene Oxide Structure in Each Molecule The hard coating composition according to the present invention contains (B) an orthophenyl phenol acrylate having 1 or 2 mols of an ethylene oxide structure in each molecule. The acrylate (B) may preferably have a viscosity of less than 300 mPa·s and a refractive index within a range of 1.56 to 1.64.

In the (meth)acrylate of the component (B), the presence of 1 or 2 mols of an alkylene oxide structure in each molecular in which the alkylene oxide structure has two or three carbon atoms enables the design of a viscosity of the component (B) of less than 300 mPa·s. In addition, the presence of 1 or 2 mols of an alkylene oxide structure in each molecular in which the alkylene oxide structure has two or three carbon atoms of the (meth)acrylate component (B) can provide improved stretchability of the resulting hard coat layer. In addition, adhesion of resulting hard coat layer toward a polycarbonate substrate can be increased by containing the component (B) in the hard coating composition.

The component (B), i.e., the orthophenyl phenol acrylate can provide a high refractive index, for example, within a range of 1.56 to 1.64, by its molecular structure.

An refractive index of the component (B) can be measured by an Abbe's refractometer in conformity with JIS (Japanese Industrial Standard) K0062.

The component (B) may preferably have a viscosity of less than 300 mPa·s. When the viscosity is more than 300 mPa·s, the composition's hardening reactivity may be deteriorated and a hardness of the resulting hard coat layer may be lowered. The component (B) may more preferably have a viscosity of 1 to 300 mPa·s, most preferably 1 to 200 mPa·s.

A viscosity of the component (B) can be measured by a B-type viscometer (TVB-22L, manufactured by Toki Sangyo co., ltd.). A B-type viscometer includes, for example, TVB-22L manufactured by Toki Sangyo co., ltd.

The component (B) may preferably have a weight average molecular weight within a range of 150 to 600, more preferably 200 to 400.

The component (B) can be prepared by chain-extending of orthophenyl phenol with ethylene oxide, then reacting the resulting reactant with (meth)acrylic acid. A commercially available product may be used as the component (B). The commercially available product may include, for example, NK ester A-LEN-10 (an ethoxylated orthophenyl phenol acrylate, produced by Shin-Nakamura Chemicals, co., ltd.), Aronix M-106 (an orthophenyl phenol EO-modified acrylate (a number of ethylene oxide structure: about 1 mole in a molecular), produced by Toagosei co., ltd.) and the like.

In the present invention, the hard coating composition contains 25 to 35 parts by mass of the component (B) providing that 100 parts by mass of a resin content in the hard coating composition. The presence of the component (B) within the above mass amount in the coating composition provides advantages such as excellent hardness and a high refractive index of the resulting hard coat layer. When an amount of the component (B) is less than 25 parts by mass, adhesion property of the resulting hard coat layer toward a transparent polymer substrate such as a polycarbonate film is lowered. When an amount of the component (B) is more than 35 parts by mass, precipitates from the hard coat layer occurs over time.

(C) a Bisphenol Structure-Containing Diacrylate Having 2 to 4 Mols of an Alkylene Oxide Structure with Two or Three Carbon Atoms in Each Molecule The hard coating composition contains (C) a bisphenol structure-containing diacrylate having 2 to 4 mols of an alkylene oxide structure with two or three carbon atoms in each molecule. The acrylate (C) can provide wettability toward a polymer substrate such as a polycarbonate film, derived from a bisphenol structure thereof, which provides advantages of increasing of adhesion property of the hard coat layer. A concrete example of the acrylate (C) may include a reactant obtained by chain-extending of bisphenol F or bisphenol A with ethylene oxide, then reacting with (meth)acrylic acid.

A commercially available product may be used as the component (C). The commercially available product may include, for example,
Aronix M-208 (a bisphenol F EO-modified diacrylate (a number of ethylene oxide structure: about 4 mole in a molecular)) and Aronix M211B (a bisphenol A EO-modified diacrylate (a number of ethylene oxide structure: about 4 mole in a molecular)), produced by Toagosei co., ltd.; Light acrylate BP-4EAL (a bisphenol A EO-addition diacrylate, (a number of ethylene oxide structure: about 4 mole in a molecular)), produced by Kyoeisha Chemical co., ltd.;
NK ester ABE-300 (an ethoxylated bisphenol A diacrylate, (a number of ethylene oxide structure: about 3 mole in a molecular) and A-BPE-4 (an ethoxylated bisphenol A diacrylate, (a number of ethylene oxide structure: about 4 mole in a molecular), produced by Shin-Nakamura Chemicals, co., ltd.); and the like.

In the present invention, the hard coating composition contains 10 to 20 parts by mass of the component (C) providing that 100 parts by mass of a resin content in the hard coating composition. When an amount of the component (C) is less than 10 parts by mass, adhesion property of the resulting hard coat layer toward a transparent polymer substrate such as a polycarbonate film is lowered. When an amount of the component (C) is more than 20 parts by mass, refractive index of resulting hard coat layer becomes lower and poor visibility may be obtained.

Another (Meth)Acrylate

A hard coating composition may contain another (meth)acrylate in addition to the components (A) to (C). Such an another (meth)acrylate includes, for example, polyfunctional (meth)acrylate monomer and/or polyfunctional (meth)acrylate oligomer. The polyfunctional (meth)acrylate monomer and/or polyfunctional (meth)acrylate oligomer can cause a cure reaction due to a (meth) acryloyl group reaction, with an exposure to active energy rays after applying the hard coating composition. The cure reaction can provide a hard coat layer with excellent hardness, in which may be advantageous.

The polyfunctional (meth)acrylate monomer and/or polyfunctional (meth)acrylate oligomer may preferably have monomer and/or oligomer having three or more (meth) acryloyl groups. Having three or more (meth) acryloyl groups can provide a hard coat layer having excellent hardness with an exposure to active energy rays, in which may be advantageous.

The polyfunctional (meth)acrylate monomer and/or polyfunctional (meth)acrylate oligomer includes, for example, hydroxypropylated trimethylolpropane triacrylate, isocyanuric acid ethylene oxide modified diacrylate, pentaerythritol triacrylate, dipentaerythritol pentaacrylate, trimethylolpropane triacrylate, tris(acryloxyethyl) isocyanurate, ditrimethylolpropane tetraacrylate, pentaerythritol tetraacrylate, dipentaerythritol hexaacrylate and oligomers thereof. The monomer and/or oligomer may be used with alone or a combination of two or more.

When the hard coating composition contains the monomer and/or oligomer, the hard coating composition may preferably contain 1 to 30 parts by mass of the monomer and/or oligomer, more preferably 1 to 25 parts by mass, providing that 100 parts by mass of a resin content in the hard coating composition.

Polymerization Initiator and the Like

The hard coating composition according to the present invention may preferably contain a polymerization initiator. Containing a polymerization initiator may provide an excellent polymerization of resin components with an exposure to active energy rays such as ultraviolet rays. The polymerization initiator includes, for example, alkyl phenon type photopolymerization initiator, acyl phosphine oxide type photopolymerization initiator, titanocene type photopolymerization initiator, oxime ester type photopolymerization initiator, and the like. An alkyl phenon type photopolymerization initiator includes, for example, 2,2-dimethoxy-1,2-diphenylethane-1-one, 1-hydroxy cyclohexyl phenyl ketone, 2-hydroxy-2-methyl-1-phenyl propane-1-one, 1-[4-(2-hydroxyethoxy)-phenyl]-2-hydroxy-2-methyl-1-propane-1-one, 2-hydroxy-1-{4-[4-(2-hydroxy-2-methyl propionyl)benzyl]phenyl}-2-methyl propan-1-one, 2-methyl-1-(4-methylthiophenyl)-4-morpholinopropan-1-one, 2-benzyl-2-dimethylamino-1-(4-morpholinophenyl)-butanone-1, 2-(dimethylamino)-2-[(4-methylphenyl) methyl]-1-[4-(4-morpholinyl)phenyl]-1-butanone and the like. An acyl phosphine oxide type photopolymerization initiator includes, for example, 2,4,6-trimethyl benzoyl diphenyl phosphine oxide, bis(2,4,6-trimethyl benzoyl) phenyl phosphine oxide and the like. A titanocene type photopolymerization initiator includes, for example, bis(η5-2,4-cyclopentadiene-1-yl)-bis(2,6-difluoro-3-(1H-pyrrol-1-yl) phenyl)titanium and the like. An oxime ester type photopolymerization initiator includes, for example, 1.2-octanedione, 1-[4-(phenylthio)-, 2-(O-benzoyloxime)], ethanone, 1-[9-ethyl-6-(2-methyl benzoyl)-9H-carbazole-3-yl]-, 1-(O-acetyl oxime), oxyphenylacetic acid, 2-[2-oxo-2-phenyl acetoxy ethoxy]ethyl ester, 2-(2-hydroxy ethoxy) ethyl ester and the like. These photopolymerization initiator may be used with alone or a combination of two or more.

In the above photopolymerization initiators, 2-hydroxy-2-methyl-1-phenyl propan-1-one, 1-hydroxy cyclohexyl phenyl ketone, 2-methyl-1-(4-methylthiophenyl)-2-morpholinopropan-1-one, 2-benzyl-2-dimethylamino-1-(4-morpholinophenyl) butanone-1, and 2,2-dimethoxy-1,2-diphenyl ethan-1-one and the like may be preferably used.

A preferable amount of the photopolymerization initiator may be 0.01 to 20 parts by mass, more preferably 1 to 10 parts by mass, providing that 100 parts by mass of the components (A), (B) and (C), and optional another (meth) acrylate (a total of all these components is called "resin components").

The hard coating composition used in the present invention may contain a solvent. A solvent is not limited and may be appropriately selected with consideration of the components of the hard coating composition, a type of a substrate to be applied, means for application and the like. A solvent includes, for example, aromatic solvents such as toluene, xylene; ketone solvents such as methyl ethyl ketone, acetone, methyl isobutyl ketone, cyclohexanone; ether solvents such as diethyl ether, isopropyl ether, tetrahydrofuran, dioxane, ethyleneglycol dimethyl ether, ethyleneglycol diethyl ether, diethyleneglycol dimethyl ether, diethyleneglycol diethyl ether, propyleneglycol monomethyl ether, anisole, phenetole; ester solvents such as ethyl acetate, butyl acetate, acetic acid isopropyl, ethylene glycol diacetate; amide solvents such as dimethylformamide, diethylformamide, N-methylpyrrolidon; cellosolve solvents such as methylcellosolve, ethylcellosolve, butyl cellosolve; alcohol solvents such as methanol, ethanol, propanol; halogen solvents such as dichloromethane, chloroform; and the like. The solvent may be used with alone or a combination of two or more. In the above solvents, ester solvents, ether solvents, alcohol solvent and ketone solvent may preferably be used.

The hard coating composition may optionally contain an additive. The additive includes conventional additives such as an antistatic agent, a plasticizer, a surfactant, an antioxidant and the like.

The hard coating composition has a technical feature that the hard coating composition can provide a hard coat layer with an high refractive index even if the hard coating composition does not contain a high refractive index material of metal oxide such as $ZnO$, $TiO_2$, $CeO_2$, $SnO_2$, $ZrO_2$ and indium tin oxide. Therefore, the hard coating composition may preferably contain no metal oxide high refractive index materials selected from the group consisting of $ZnO$, $TiO_2$, $CeO_2$, $SnO_2$, $ZrO_2$ and indium tin oxide. For more details, a total content of $ZnO$, $TiO_2$, $CeO_2$, $SnO_2$, $ZrO_2$ and indium tin oxide in the hard coating composition may preferably be less than or equal to 0.0001% by mass. When the high refractive index materials such as a metal oxide are included in a hard coat layer, the hard coat layer generally has inferior stretchability and bending resistance compared with a hard coat layer without the high refractive index materials.

The hard coat layer formed by applying the hard coating composition has a technical feature of a high refractive index within a range of 1.565 to 1.575, as well as high visibility and excellent hardness of the hard coat layer. Thanks to the high refractive index of the hard coat layer, it is advantageous that the transparent electroconductive laminate has prevention of the appearance of interference fringes.

The hard coat layer obtained by applying the hard coating composition has a technical characteristic of having excellent stretchability and adhesion property toward a polycarbonate substrate, as well as excellent visibility and excellent hardness which is required in the field of a hard coat layer. The excellent stretchability can provide remarkably-improved visibility of the transparent electroconductive laminate and is advantageous. In a processing for applying a transparent electrically conducting layer for producing an electroconductive laminate, a substrate film having a hard coat layer tends to be exposed to a partial load. For example, the partial load may cause a swell or a kink of a film which results from a difference of thermal shrinkage and/or thermal expansion among a hard coat layer and a substrate film. The swell or the kink of a film provides deterioration of visibility due to visually distinguish about presence or absence of a transparent electrically conductive layer such as ITO. The deterioration of visibility distinctly deteriorates visibility of a touch panel.

The hard coat layer obtained by applying the hard coating composition has a technical characteristic of having stretchability, as well as excellent visibility and excellent hardness which is required in the field of a hard coat layer. Even if a substrate film is exposed to a partial thermal load such as heating at a stage of applying a transparent electrically conductive layer and obtains a partial thermal expansion, the hard coat film has advantages because of excellent stretchability of the hard coat layer and accompanying followings of the hard coat layer. Therefore, it is advantageous that deterioration of visibility due to visually distinguish about presence or absence of a transparent electrically conductive layer such as ITO is solved. In addition, the hard coat layer according to the present invention also has a feature of excellent adhesion property toward a polycarbonate substrate. The excellent adhesion property of the hard coat layer according to the present invention toward a polycarbonate substrate can prevent occurrence of problem which is a stripping of the hard coat layer and/or other layers attached with stripping of a protection film caused by week adhesion property, when the electroconductive laminate according to the present invention is protected by the protection film and the protection film is stripped.

The hard coat layer is formed applying the hard coating composition on a polycarbonate substrate and cured. A method for applying the hard coating composition can be accordingly selected depending on conditions of the hard coating composition and a coating process, and may include, for example, a dip coating method, an air knife coating method, a curtain coating method, a roller coating method, a wire bar coating method, a gravure coating method, an extrusion coating method (in U.S. Pat. No. 2,681,294) and the like.

A thickness of the hard coat layer is not limited and can be accordingly selected depending on various conditions. For example, the hard coating composition may be applied so as to obtain a hard coating layer having a thickness of 0.01 µm to 20 µm. In case that the hard coat layer is used for color difference adjusting, the hard coating composition may be applied so as to obtain a film thickness with optical interference.

A hard coat layer is formed by curing a coating film obtained by applying of the hard coating composition. The curing may be caused by irradiation of light, by a light source which emits active energy ray with suitable wavelength. As the irradiation of active energy ray, a light having exposure value of, for example, 0.1 to 1.5 J/cm$^2$, preferably 0.3 to 1.5 J/cm$^2$, may be used. A wavelength region of the irradiation of light is not limited and may appropriately be, for example, not greater than 360 nm. A light with such wavelength can be obtained by a high-pressure mercury lamp, an extra high-pressure mercury lamp and the like.

As for the hard coat layer according to the present invention, a contact angle of a solution containing 85 parts by mass of sum of the components (A), (B) and (C) and 15 parts by mass of methyl isobutyl ketone (a testing hard coating composition) may preferably be 10 to 30°, more preferably 15 to 25°, most preferably 20 to 25°, in which the contact angle is measured by dropping the testing hard coating composition onto a polycarbonate substrate. When the contact angle is within the above-described range, there are advantages such as excellent expression of anchor effects toward a polycarbonate substrate, excellent adhesion property, prevention of whitening of the hard coat layer due to excessive anchor effects.

Color Difference Adjusting Layer

The electroconductive laminate according to the present invention has a color difference adjusting layer on a hard coat layer. The color difference adjusting layer may preferably be a layer existing between the hard coat layer and a transparent electrically conducting layer. The color difference adjusting layer may be a single layer or may be a layer composed of two or more layers. The color difference adjusting layer is a layer for improving the adhesion between layers and the optical properties (the transmittance, the color tone and the like) of the transparent electroconductive laminate.

In the present invention, the color difference adjusting layer is a layer containing a curing resin component (i), and metal oxide particles having an average primary particle diameter of 100 nm or less (ii) and/or metal fluoride particles having an average primary particle diameter of 100 nm or less (iii). In this context, provided that the total mass of the particles (ii) and (iii) in the color difference adjusting layer lies within the range of 0 to 200 parts by mass with respect to 100 parts by mass of the curing resin component (i).

As the curing resin component (i), an ultraviolet curing resin or a thermosetting resin can be used. With regard to the color difference adjusting layer in the present invention, it is more preferred that an ultraviolet curing resin be used as the curing resin component (i).

The ultraviolet curing resin can be obtained from a composition containing a monomer having ultraviolet curing performance. Examples of the monomer having ultraviolet curing performance include monofunctional and polyfunctional acrylates such as a polyol acrylate, a polyester acrylate, a urethane acrylate, an epoxy acrylate, a modified styrene acrylate, a melamine acrylate and a silicon-containing acrylate.

Specific examples of the monomer include trimethylolpropane trimethacrylate, a trimethylolpropane ethylene oxide-modified acrylate, a trimethylolpropane propylene oxide-modified acrylate, an isocyanuric acid alkylene oxide-modified acrylate, pentaerythritol triacrylate, dipentaerythritol hexaacrylate, dimethylol tricyclodecane diacrylate, tripropylene glycol triacrylate, diethylene glycol diacrylate, 1,6-hexanediol diacrylate, an epoxy-modified acrylate, a urethane-modified acrylate such as a urethane (meth)acrylate, and a polyfunctional monomer such as an epoxy-modified acrylate. These monomers may be used alone or two or more thereof may be used together.

Of these monomers having ultraviolet curing performance, a urethane-modified acrylate is preferred. As the urethane-modified acrylate, a commercial product thereof can be used, and for example, products in the SHIKOH series available from The Nippon Synthetic Chemical Industry Co., Ltd. such as UV1700B, UV6300B, UV765B, UV7640B and UV7600B; products in the Art Resin series available from Negami Chemical Industrial Co., Ltd. such as Art Resin HDP, Art Resin UN9000H, Art Resin UN3320HA, Art Resin UN3320HB, Art Resin UN3320HC, Art Resin UN3320HS, Art Resin UN901M, Art Resin UN902MS and Art Resin UN903; UA100H, U4H, U6H, U15HA, UA32P, U6LPA, U324A, U9HAMI and the like available from Shin Nakamura Chemical Co., Ltd.; products in the Ebecryl series available from Daicel-UCB Co. Ltd., such as 1290, 5129, 254, 264, 265, 1259, 1264, 4866, 9260, 8210, 204, 205, 6602, 220 and 4450; products in the BEAMSET series available from ARAKAWA CHEMICAL INDUSTRIES, LTD., such as 371, 371MLV, 371S, 577, 577BV and 577AK; products in the RQ series available from MITSUBISHI RAYON CO., LTD.; products in the UNIDIC series available from DIC Corporation; DPHA40H (available from Nippon Kayaku Co., Ltd.), CN9006 and CN968 (available from SARTOMER company), and the like can be used.

In the case where the curing resin component (i) is an ultraviolet curing resin, it is preferred that a composition forming the color difference adjusting layer contain a photopolymerization initiator. As the photopolymerization initiator, for example, a photopolymerization initiator commonly used such as acetophenone, benzophenone, benzoin, benzoylbenzoate and thioxanthone can be used.

The composition forming the color difference adjusting layer may further contain a photosensitizer. As the photosensitizer, for example, a photosensitizer commonly used such as triethylamine and tri-n-butylphosphine can be used.

The composition forming the color difference adjusting layer may further contain hydrolysates of various alkoxysilanes.

In the case where the curing resin component (i) is a thermosetting resin, the composition forming the color difference adjusting layer may contain a thermosetting monomer such as an organosilane-based thermosetting monomer in which a silane compound such as methyltriethoxysilane or phenyltriethoxysilane constitutes a monomer, a melamine-based thermosetting monomer in which an etherified methylolmelamine or the like constitutes a monomer, an isocyanate-based thermosetting monomer, a phenol-based thermosetting monomer and an epoxy-based thermosetting monomer. These thermosetting monomers may be used alone or two or more thereof may be used in combination. In addition to the above-mentioned thermosetting monomer, the composition may contain a thermoplastic resin component as necessary.

In the case where the curing resin component (i) is a thermosetting resin, it is preferred that the composition forming the color difference adjusting layer contains a reaction accelerator or a curing agent. Examples of the reaction accelerator include triethylenediamine, dibutyltin dilaurate, benzyl methylamine, pyridine and the like. Examples of the curing agent include methylhexahydrophthalic anhydride, 4,4'-diaminodiphenylmethane, 4,4'-diamino-3,3'-diethyldiphenylmethane, diaminodiphenylsulfone and the like.

In the present invention, in addition to the above-mentioned curing resin component (i), metal oxide particles having an average primary particle diameter of 100 nm or less (ii) and/or metal fluoride particles having an average primary particle diameter of 100 nm or less (iii) are contained in the color difference adjusting layer. Then, provided that the total mass of these particles (ii) and (iii) lies within the range of 0 to 200 parts by mass with respect to 100 parts by mass of the curing resin component (i). The total mass of the particles (ii) and (iii) can be appropriately adjusted depending on the refractive index of each of (i), (ii) and (iii) in order to attain desired optical properties. From the viewpoint of film strength after curing, it is preferred that the total mass lie within the range of 1 to 150 parts by mass, and it is more preferred that the total mass lie within the range of 1 to 100 parts by mass, with respect to 100 parts by mass of the curing resin component (i).

In the case where the total mass of the particles (ii) and (iii) in the color difference adjusting layer exceeds 200 parts by mass, there occurs a defect that the adhesion between layers is deteriorated.

Specific examples of the metal oxide particles (ii) include $ZnO$, $TiO_2$, $CeO_2$, $SnO_2$, $ZrO_2$, an indium-tin oxide and the like. Any of these metal oxide particles (ii) are characterized as having a high refractive index. On that account, a color difference adjusting layer in which the metal oxide particles (ii) are contained basically becomes a high refractive index layer. As the metal oxide particle (ii), $ZnO$, $TiO_2$ and $ZrO_2$ are more preferably used. The metal oxide particles (ii) may be used alone or two or more thereof may be used together.

In this connection, as described above, provided that any of these metal oxide particles (ii) have an average primary particle diameter of 100 nm or less. In the case where the average primary particle diameter exceeds 100 nm, there occurs a defect that the haze value rises, drawbacks in appearance such as the formation of a lump like foreign materials are caused since the particles of a visible size are easily formed due to aggregation of particles and the like at the time of forming the color difference adjusting layer. In the present specification, the average primary particle diameter refers to a 50% volume particle diameter at the time of measuring a liquid prepared by dispersing particles in a solvent such as n-BuOH with a particle size analyzer.

Specific examples of a metal constituting the metal fluoride particles (iii) include calcium, barium, magnesium, strontium and the like. Of these metals, it is more preferred that the metal be magnesium. These metal fluoride particles (iii) may be used alone or two or more thereof may be used together. In this connection, as necessary, the metal fluoride particles (iii) and $SiO_2$ may be used in combination.

Any of these metal fluoride particles (iii) are characterized as having a low refractive index. On that account, a color difference adjusting layer in which the metal fluoride particles (iii) are contained basically becomes a low refractive index layer. In this connection, as described above, provided that any of these metal fluoride particles (iii) have an average primary particle diameter of 100 nm or less. In the case where the average primary particle diameter exceeds 100 nm, there occurs a defect that the haze value rises, drawbacks in appearance such as the formation of a lump like foreign materials are caused, since the particles of a visible size are easily formed due to aggregation of particles and the like at the time of forming the color difference adjusting layer.

The color difference adjusting layer in the present invention may be composed of a single layer or may be composed of two or more layers. In the case where the color difference adjusting layer is a single layer, it is preferred that the layer be a high refractive index layer containing the metal oxide particles (ii). Examples of another aspect thereof include an aspect containing both the metal oxide particles (ii) and the metal fluoride particles (iii) mentioned above. The thickness of the color difference adjusting layer in the case where the color difference adjusting layer is a single layer is preferably 30 to 300 nm, more preferably 50 nm to 200 nm.

Moreover, for example, in the case where the color difference adjusting layer is a layer composed of two layers, it is preferred that the layer have a two-layered structure composed of a high refractive index layer containing the metal oxide particles (ii) and a low refractive index layer containing the metal fluoride particles (iii). In this case, it is more preferred to be an aspect in which a hard coat layer and the high refractive index layer are brought into contact with each other. In the case where the color difference adjusting layer is constituted of two layers composed of one layer of a high refractive index layer and one layer of a low refractive index layer, the thickness of the whole color difference adjusting layer is preferably 30 to 300 nm, more preferably 50 nm to 200 nm.

With regard to the formation of the color difference adjusting layer, for example, the layer can be formed by applying a composition containing a monomer having ultraviolet curing performance and the metal oxide particles (ii) and/or the metal fluoride particles (iii) on a hard coat layer of a transparent polymer substrate having the hard coat layer, and then, irradiating the composition with active energy rays such as ultraviolet rays to cure the composition. Alternatively, the layer can be formed by applying a composition containing a thermosetting monomer and the metal oxide particles (ii) and/or the metal fluoride particles (iii) on a hard coat layer of a transparent polymer substrate having the hard coat layer, and then, thermally curing the composition.

As an example of the case where the color difference adjusting layer is a layer composed of two layers, a color difference adjusting layer composed of two layers can be formed by firstly applying a composition containing the metal oxide particles (ii) on a hard coat layer and curing the composition, and then, applying a composition containing the metal fluoride particles (iii) and curing the composition.

As another example of the case where the color difference adjusting layer is a layer composed of two layers, a color difference adjusting layer composed of two layers can be formed by firstly applying a composition containing the metal fluoride particles (iii) on a hard coat layer and curing the composition, and then, applying a composition containing the metal oxide particles (ii) and curing the composition.

Examples of a method for applying the composition include an applying method using a coating machine such as a doctor knife, a bar coater, a gravure roll coater, a curtain coater, a knife coater or a spin coater which is usually performed by a person skilled in the art, an applying method using a spray, an applying method by immersion and the like.

Moreover, the composition may contain an organic solvent as necessary. Examples of the organic solvent include alcohol-based solvents such as ethanol, isopropyl alcohol, butanol and 1-methoxy-2-propanol, hydrocarbon-based solvents such as hexane, cyclohexane, ligroin and cyclohexanone, ketone-based solvents such as methyl isobutyl ketone and isobutyl acetate, aromatic hydrocarbon-based solvents such as xylene and toluene, and the like. These organic solvents may be used alone or two or more thereof may be used together.

In the case of curing a composition containing a monomer having ultraviolet curing performance, the curing can be performed by using a light source emitting active energy rays of a required wavelength and irradiating the composition with the active energy rays. As the active energy ray to be irradiated, for example, light of 0.1 to 1.5 J/cm$^2$ in terms of an exposure quantity, preferably light of 0.3 to 1.5 J/cm$^2$, can be used. Moreover, although the wavelength of the irradiation light is not particularly limited, for example, irradiation light having a wavelength of 360 nm or less and the like can be used. Such light can be obtained by using a high pressure mercury lamp, an ultra-high pressure mercury lamp or the like.

Moreover, in the case of curing a composition containing a thermosetting monomer, for example, the composition can be cured by heating at 60 to 140° C. for 1 to 60 minutes. In this context, the heating temperature and the heating time can be selected according to the kind of the thermosetting monomer contained in the composition.

Electrically Conducting Layer and Electroconductive Laminate

With regard to the electroconductive laminate according to the present invention, an electrically conducting layer is generally formed on the hard coat layer or the color difference adjusting layer. The electrically conducting layer may be a transparent electrically conducting layer where whole of an electroconductive laminate is transparent, and may be a metal electrically conducting layer where an electroconductive laminate is not transparent. Although no particular restriction is put on the constituent material for the transparent electrically conducting layer, examples thereof include a metal layer and a metal compound layer. Examples of a component constituting the transparent electrically conducting layer include a layer of a metal oxide such as silicon oxide, aluminum oxide, titanium oxide, magnesium oxide, zinc oxide, indium oxide and tin oxide. Of these, a crystalline layer composed mainly of indium oxide is preferred, and in particular, a layer composed of crystalline ITO (Indium Tin Oxide) is preferably used.

Moreover, in the case where the transparent electrically conducting layer is composed of crystalline ITO, although it is not particularly necessary to provide an upper limit to the crystal grain size, it is preferred that the crystal grain size be 500 nm or less. When the crystal grain size exceeds 500 nm, it is not preferred because the bending durability deteriorates. In this context, the crystal grain size is defined as a maximum size among diagonal lines or diameters in each area having a polygonal shape or an elliptical shape observed with a transmission electron microscope (TEM). In the case where the transparent electrically conducting layer is composed of amorphous ITO, the environmental reliability may be lowered.

The electrically conducting layer can be formed by a known method, and for example, a physical vapor deposition method such as a DC magnetron sputtering method, an RF magnetron sputtering method, an ion plating method, a vacuum vapor deposition method or a pulse laser deposition method can be used. In the case where attention is paid to industrial productivity such that a metal compound layer with a uniform film thickness is formed on a large area, a DC magnetron sputtering method is desirable. In this connection, although a chemical vapor deposition method such as a chemical vapor phase deposition method or a sol-gel method can also be used in addition to the physical vapor deposition method (PVD method), from the viewpoint of film thickness control, a sputtering method is still desirable.

The film thickness of the electrically conducting layer is preferably 5 to 50 nm from the points of transparency and electrical conductivity. The film thickness is further preferably 5 to 30 nm. When the film thickness of the electrically conducting layer is less than 5 nm, there is a tendency that stability resistance value with the lapse of time lowers. When the film thickness exceeds 50 nm, an electroconductive laminate prepared with the electrically conducting layer is not preferred as a touch panel because of lowering in bending durability.

In the case where the electroconductive laminate according to the present invention is used as a touch panel, from aspects of reduction in power consumption of a touch panel, the need for circuit processing and the like, it is preferred that a transparent electrically conducting layer in which the surface resistance value of the transparent electrically conducting layer with a film thickness of 10 to 40 nm lies within the range of 10 to 2000 Ω/square, more preferably 30 to 1000 Ω/square, be used.

In this connection, as the transparent electrically conducting layer, a layer formed by coating a dispersion prepared by dispersing a metal nanowire, a carbon nanotube, electroconductive oxide fine particles and the like on a polymer substrate by a wet process (for example, a spin coating method, gravure coating, slot die coating, or printing) can also be used.

The electrically conducting layer thus formed is subjected to pattern formation by an etching treatment. The etching treatment is generally performed by covering the electrically conducting layer with a mask for forming a pattern, and then, etching the electrically conducting layer with an etchant such as an acid aqueous solution. Examples of the etchant include inorganic acids such as hydrogen chloride, hydrogen bromide, sulfuric acid, nitric acid and phosphoric acid, organic acids such as acetic acid, a mixture thereof, and an aqueous solution thereof. Specific examples of the etchant include a strong acid aqueous solution obtained by a mixing of 12 N hydrochloric acid, 16 N nitric acid and water in a mass ratio of 12 N hydrochloric acid:16 N nitric acid:water being 3.3:1.0:7.6.

In this connection, a heat treatment may be performed as necessary before or after patterning the electrically conducting layer. In the case where the electrically conducting layer is composed of ITO which crystallizes by the heat treatment, by performing a heat treatment, there is an advantage that the transparency and the electrical conductivity can be enhanced. For example, the heat treatment can be performed by heating at 100 to 150° C. for 15 to 180 minutes.

The electroconductive laminate according to the present invention is characterized as having a difference ΔR of R1 and R2 of not greater than 1, wherein R1 is a reflectance obtained by irradiation with a light source having a wavelength in a range of 500 to 750 nm toward the electroconductive laminate, and R2 is a reflectance obtained by irradiation with a light source having a wavelength in a range of 500 to 750 nm toward a electroconductive laminate after immersion into a strong acid aqueous solution at 40° C. for three minutes and dried, wherein the strong acid aqueous solution is obtained by a mixing of 12 N hydrochloric acid, 16 N nitric acid and water in a mass ratio of 12 N hydrochloric acid:16 N nitric acid:water being 3.3:1.0:7.6.

The strong acid aqueous solution is a strong acid aqueous solution which is so-called aqua regia commonly used in an etching treatment. By performing an etching treatment with the strong acid aqueous solution, it follows that the electrically conducting layer is etched. FIG. 1 is a schematic explanatory view showing an electroconductive laminate subjected to an etching treatment. An electroconductive laminate (10) has a structure in which a hard coat layer (3), a color difference adjusting layer (5), and a transparent electrically conducting layer (7) are formed in this order on one surface of a polycarbonate substrate (1). In this context, the portion shown by a reference numeral (11) is a portion from which the transparent electrically conducting layer (7) was eliminated by patterning by an etching treatment, and the portion shown by a reference numeral (13) is a portion which had been covered with a mask at the time of the etching treatment and a portion in which the electrically conducting layer has been left as it is. In this context, the reflectance R1 means a reflectance at the portion of the reference numeral (13) in FIG. 1, and the reflectance R2 means a reflectance at the portion of the reference numeral (11) in FIG. 1. Then, the electroconductive laminate according to the present invention is characterized as having a difference ΔR of R1 and R2 of not greater than 1, which are reflectances obtained by irradiation with a light source having a wavelength in a range of 500 to 750 nm. That is, in the electroconductive laminate according to the present invention, there is almost no difference of reflectance between a part where the electrically conducting layer (7) exists and a part where the electrically conducting layer (7) does not exist. This achieves an extremely high level of visibility.

With regard to the measurement of the reflectance of the electroconductive laminate, for example, using a spectrophotometer such as U-3000 available from Hitachi, Ltd., the spectral reflectance at an incident angle of 10° can be measured in accordance with JIS K5600-4-5.

Antiblocking Layer

The electroconductive laminate according to the present invention has a structure in which a hard coat layer, a color difference adjusting layer, and an electrically conducting layer are formed in this order on one surface of a polycarbonate substrate. The electroconductive laminate may optionally have an antiblocking layer formed on the other side of the polycarbonate substrate. Forming the antiblocking layer on the other side of the substrate can prevent occurrence of blocking in a production process of the electroconductive laminate, which provides improved preservation stability.

A composition for forming an antiblocking layer includes, for example, a composition for an antiblocking layer containing a first component and a second component. It may be preferable that the composition is a composition for an antiblocking layer in which a difference of SP values (ΔSP) of the first component (SP1) and the second component (SP2) is within a range of 1 to 2, and phase separation occurs between the first component and the second component after the composition for forming an antiblocking layer is applied, to form an antiblocking layer having a microscopic convexoconcave on its surface.

An unsaturated double bond containing acrylic copolymer is used as the first component. The unsaturated double bond containing acrylic copolymer includes, for example, a resin obtained by copolymerization of (meth)acrylic monomer and other ethylenically unsaturated double bond containing monomer;

a resin obtained by a reaction of (meth)acrylic monomer with other ethylenically unsaturated double bond and epoxy group containing monomer; and a resin obtained by addition reaction of a component having both of an unsaturated double bond and other functional group, for example, acrylic acid or glycidyl acrylate, to a resin obtained by a reaction of (meth)acrylic monomer with other ethylenically unsaturated double bond and isocyanate containing monomer.

These unsaturated double bond containing acrylic copolymers can be used with alone or a combination of two or more.

The unsaturated double bond containing acrylic copolymer may preferably have a weight-average molecular weight of 2000 to 100000, more preferably 5000 to 50000.

A polyfunctional unsaturated double bond containing monomer or oligomer thereof may be preferably used as the second component (monomer or oligomer). An "oligomer" used in the present specification means a polymerization product having a repeat unit, in which the number of the repeat unit is 3 to 10. The polyfunctional unsaturated double bond containing monomer includes, for example, a polyfunctional acrylate obtained by dealcoholization reaction of a polyalcohol and (meth)acrylate, specifically, dipentaerythritol hexa(meta)acrylate, dipentaerythritol penta(meta)acrylate, trimethylol propane tri(meta)acrylate, ditrimethylolpropane tetra(meta)acrylate, neopentylglycol di(meta)acrylate, and the like. In addition, an acrylate monomer having polyethylene glycol structure such as polyethylene glycol #200 diacrylate (produced by Kyoeisha Chemical Co., Ltd.) may be used. These polyfunctional unsaturated double bond containing monomers can be used with alone or a combination of two or more. The second component may preferably be a polyfunctional acrylate.

In case that the first component and the second component are the above combinations, a suitable solvent includes, for example, a ketone solvent such as methyl ethyl ketone, acetone, methyl isobutyl ketone, cyclohexanone and the like; an alcohol solvent such as methanol, ethanol, propanol, isopropanol, butanol and the like; an ether solvent such as anisole, phenetole, propylene glycol monomethylether, ethyleneglycol dimethyl ether, ethyleneglycol diethyl ether, diethyleneglycol dimethyl ether, diethyleneglycol diethyl ether, and the like. These solvents may be used with alone or a combination of two or more.

The composition for forming an antiblocking layer may preferably contain a photopolymerization initiator. The photopolymerization initiator includes, for example, 2-hydroxy-2-methyl-1-phenyl propan-1-one, 1-hydroxy cyclohexyl phenyl ketone, 2-methyl-1-[4-(methylthio)phenyl]-2-morpholino propan-1-one, 2,2-dimethoxy-1,2-diphenylethan-1-one, 2-benzyl-2-dimethylamino-1-(4-morpholino phenyl)-butanone-1, and the like.

In the composition for forming an antiblocking layer, a difference of SP values of the first component and the second component provides phase separation. An antiblocking layer having microscopic convexoconcave on its surface can be formed by the phase separation. The difference of SP values of the first component and the second component may preferably be not less than 1, more preferably within a range of 1 to 2.

When the difference of the first component and the second component is not less than 1, the first component and the second component are less compatible. Thus phase separation seems to occur between the first component and the second component after the composition for forming an antiblocking layer is applied.

A SP value means a solubility parameter, and is a criterion for solubility. The more SP value means a higher polarity, and the little SP value means a lower polarity.

The SP value can be determined by the following procedure.
Reference: Suh, Clarke [J.P.S.A.-1, 5, 1671-1681 (1967)]
Measuring temperature: 20° C.
Sample: A resin (0.5 g) is measured and is put into a 100 ml beaker, next, 10 ml of a good solvent is added using a whole pipette and is dissolved by means of a magnetic stirrer.
Solvent:
Good solvent: Dioxane, acetone, and the like
Poor solvent: n-Hexane, deionized water, and the like
Determination of cloud point: Using a 50 ml biuret, the poor solvent is dropped and read the amount dripped up to the point where clouding takes place.

A SP value δ of a resin is given by the following equation:

$$\delta = (V_{ml}^{1/2}\delta_{ml} + V_{mh}^{1/2}\delta_{mh})/(V_{ml}^{1/2} + V_{mh}^{1/2})$$

$$V_m = V_1 V_2/(\phi_1 V_2 + \phi_2 V_1)$$

$$\delta_m = \phi_1 \delta_1 + \phi_2 \delta_2$$

$V_i$: a molar volume of each solvent (ml/mol)
$\phi_i$: a volume fraction of each solvent at cloud point
$\delta_i$: a SP value of each solvent
ml: low SP poor solvent mixture system
mh: high SP poor solvent mixture system The composition for forming an antiblocking layer may further contain conventional additives such as an antistatic agent, a plasticizer, a surfactant, an antioxidant, an ultraviolet absorber and the like.

The composition for forming an antiblocking layer may contain a conventional resin component in addition to the first component and the second component. The composition for forming an antiblocking layer has a technical feature of obtaining a resin layer with convexoconcave without including particles such as resin particles. Therefore the composition for forming an antiblocking layer may preferably include no resin particles. On the other hand, the composition for forming an antiblocking layer may optionally contain at least one of inorganic particles, organic particles and a complex material thereof. These particles can be added not for the purpose of forming convexoconcave on a surface of the resin layer. These particles can be added for the purpose of controlling phase separation and a segregation to obtain more microscopic convexoconcave. These particles may have a mean diameter of not greater than 0.5 μm, preferably 0.01 μm to 0.3 μm. When the mean diameter is more than 0.5 μm, a transparency may slightly be deteriorated.

Examples of the inorganic particles include at least one selected from the group consisting of silica, alumina, titania, zeolite, mica, synthetic mica, calcium oxide, zirconium oxide, zinc oxide, magnesium fluoride, smectite, synthetic smectite, vermiculite, ITO (indium oxide/tin oxide), ATO (antimony oxide/tin oxide), tin oxide, indium oxide and antimony oxide.

Examples of the organic particles include at least one selected from the group consisting of acrylic, olefin, polyether, polyester, urethane, polyester, silicone, polysilane, polyimide and fluorine particles.

The composition for forming an antiblocking layer can be prepared by mixing the first component and the second component, and an optional solvent, and optional additives such as a photopolymerization initiator, a catalyst, a photosensitizer. A mass ratio of the first component and the second component in the composition for forming an antiblocking layer may preferably satisfy the following formula,
the first composition: the second composition being 0.1:99.9 to 50:50, more preferably 0.3:99.7 to 20:80, most preferably 0.5:99.5 to 10:90. In case that an additive such as a photopolymerization initiator, a catalyst or a photosensitizer are included in the composition, total amount of the additives may preferably be 0.01 to 20 parts by mass providing that 100 parts by mass of a total mass of the first component and the second component (a total of all these components is called "resin components"), more preferably 1 to 10 parts by mass. In case that a solvent are included in the composition, an amount of the solvent may preferably be 1 to 9900 parts by mass providing that 100 parts by mass of a total mass of the first component and the second component, more preferably 10 to 900 parts by mass.

The composition for forming an antiblocking layer is applied and cured to form an antiblocking layer having a microscopic convexoconcave on its surface. A method for applying the composition for forming an antiblocking layer may include, for example, a dip coating method, an air knife coating method, a curtain coating method, a roller coating method, a wire bar coating method, a gravure coating method, an extrusion coating method and the like. A thickness of the antiblocking layer may be, for example 0.01 µm to 20 µm.

After applying the composition for forming an antiblocking layer, phase separation and curing are generated by irradiation of light. As the irradiation of light, a light having exposure value of, for example, 0.1 to 3.5 J/cm$^2$, preferably 0.5 to 1.5 J/cm$^2$, may be used. A wavelength region of the irradiation of light is not limited and may appropriately be, for example, not greater than 360 nm. A light with such wavelength can be obtained by a high-pressure mercury lamp, an extra high-pressure mercury lamp and the like.

Touch Panel

A touch panel according to the present invention has the transparent electroconductive laminate. The touch panel according to the present invention includes, for example, an electrostatic capacity type touch panel. The transparent electroconductive laminate according to the present invention may also be used in a resistive film type touch panel.

An embodiment of layer formation in use of the transparent electroconductive laminate as a substrate for a touch panel includes the following constructions:

a transparent electrically conductive layer/a color difference adjusting layer/a hard coat layer/a polycarbonate substrate;

a transparent electrically conductive layer/a hard coat layer/a polycarbonate substrate;

a transparent electrically conductive layer/a color difference adjusting layer/a hard coat layer/a polycarbonate substrate/an antiblocking layer;

a transparent electrically conductive layer/a hard coat layer/a polycarbonate substrate/an antiblocking layer;

a transparent electrically conductive layer/a color difference adjusting layer/a hard coat layer/a polycarbonate substrate/a hard coat layer/a color difference adjusting layer/a transparent electrically conductive layer;

a transparent electrically conductive layer/a hard coat layer/a polycarbonate substrate/a hard coat layer/a color difference adjusting layer/a transparent electrically conductive layer;

an auxiliary electrode layer/a transparent electrically conductive layer/a color difference adjusting layer/a hard coat layer/a polycarbonate substrate;

an auxiliary electrode layer/a transparent electrically conductive layer/a hard coat layer/a polycarbonate substrate;

an auxiliary electrode layer/a transparent electrically conductive layer/a color difference adjusting layer/a hard coat layer/a polycarbonate substrate/an antiblocking layer;

an auxiliary electrode layer/a transparent electrically conductive layer/a color difference adjusting layer/a hard coat layer/a transparent polymer substrate/an antiblocking layer;

an auxiliary electrode layer/a transparent electrically conductive layer/a color difference adjusting layer/a hard coat layer/a polycarbonate substrate/a hard coat layer/a color difference adjusting layer/a transparent electrically conductive layer/an auxiliary electrode layer;

an auxiliary electrode layer/a transparent electrically conductive layer/a hard coat layer/a polycarbonate substrate/a hard coat layer/a transparent electrically conductive layer/an auxiliary electrode layer.

The above-mentioned layer constitution means an order of from a top layer to a bottom layer. A metal-oxide layer, for example, a layer composed of a metal oxide such as silicon dioxide or niobium oxide, molybdenum oxide, may be formed directly under the a transparent electrically conductive layer in order to improve a color difference adjusting or adhesion property. A hard coat layer for surface protection may be formed on a transparent electrically conductive layer as a top layer. In that case, the hard coat layer may be the hard coat layer according to the present invention, or may be a conventional hard coat layer other than the hard coat layer according to the present invention.

The auxiliary electrode layer referred to herein means a layer usable as an electrode material for wiring. As the material of the auxiliary electrode layer, one with a specific resistance of $1\times10^{-6}$ Ωcm or more and $1\times10^{-4}$ Ωcm or less is desirable. When a metal material with a specific resistance of less than $1\times10^{-6}$ Ωcm is used, the layer is unstable from the viewpoints of uses and functions and it becomes difficult to form the layer as a thin film. On the other hand, when a metal material with a specific resistance of more than $1\times10^{-4}$ Ωcm is used, the resistance value becomes higher at the time of forming fine wiring since the resistance value is too high. For the foregoing reasons, as a metal suitable for practical use, a single metal selected from the group of Cu, Ag, Al, Au, Ni, Ni/Cr and Ti, or an alloy composed of a plurality of metals is recommended. In particular, from the points of being a metal which is high in electrical conductivity and excellent in processability such as pattern etching and electroplating, being satisfactory in electrical and mechanical connectability between an electrode and a lead part of a circuit or the like (solder, an anisotropic conductive connector and the like), being strong against bending, being high in thermal conductivity and being inexpensive, Cu, Al and the like are preferred and Cu is especially preferred.

Although the thickness of the auxiliary electrode layer is not particularly limited, the range of 0.001 to 100 µm in a usual design specification, preferably 0.01 to 25 µm, is recommended. Although a known treatment method can be used for the formation of an auxiliary electrode, it is preferred to form the electrode by a sputtering method. Afterward, as necessary, the conductivity may be enhanced by performing electrolytic/electroless wet metal plating or the like to further make the film thickness thick.

Moreover, as necessary, for the purpose of the protection (mainly oxidation prevention) of the auxiliary electrode layer, a high melting point metal layer composed of Ni, Ni/Cr, Cr, Ti, Mo and the like and an oxide layer composed of oxides thereof may be disposed as upper and lower layers of the auxiliary electrode layer.

Protection Film

The electroconductive laminate according to the present invention is frequently stored and used in the state of covering a protection film thereon. The protection film is a film so as to avoid damage of the electroconductive laminate, when external pressure is applied from the outside. An example of the protection film may include a commodity plastic film such as polyethylene, polypropylene, polyethylene terephthalate, with an adhesive layer obtained by applying an adhesive such as an acrylic-type adhesive, a polyolefin-type adhesive, a vinyl acetate-type adhesive. However, the protection film is not limited thereof and may appropriately be selected in view of practically required properties. For example, as for an electroconductive laminate containing a polycarbonate substrate, a protection film made of polycarbonate having similar heat resistance and behavior of thermal expansion/thermal shrinkage may preferably be used so as to prevent occurrence of warpage under heat processing with the protection film.

The protection film may preferably have a film thickness of 20 to 200 µm, more preferably 50 to 125 µm, which however is not limited. The protection film may have various film thickness and be various form, as long as the protection film can protect the electroconductive laminate and cannot provide inconvenient processing. The protection film has an adhesive layer obtained by applying an adhesive, for layering the electroconductive laminate, which provides attachment of the protection film toward the electroconductive laminate.

The electroconductive laminate according to the present invention has specific features of mere stripping of the protection film without damage of the electroconductive laminate when the protection film is stripped, after the electrically conducting layer is protected by the protection film thereon and is stored.

EXAMPLES

The present invention will be further explained in detail in accordance with the following examples, but it is not construed as limiting the present invention to these examples. In the examples, "part" and "%" are based on mass unless otherwise specified.

Production Example 1

Production of a Phenolic Novolac Acrylate (1)

In a reaction vessel equipped with a stirrer, a thermometer, a dropping funnel and a reflux apparatus, 150 g of phenol novolac resin (a weight average molecular weight of 700 to 900, an epoxy equivalent of 150 to 200) and 550 g of epichlorohydrin were mixed, and 110 g of an aqueous solution of sodium hydroxide (48.5%) was added dropwise for 2 hours under a temperature of 100° C. and a reduced pressure of 100 to 200 mmHg.

After the reaction was finished, a reaction temperature of the reaction mixture was lowered to a room temperature, and excess amounts of an aqueous solution of sodium hydroxide were neutralized with an acid, then the reaction mixture was heated under a reduced pressure to remove excess amounts of epichlorohydrin.

Next, the resulting reaction mixture was dissolved in methyl isobutyl ketone, and a salt of byproduct was removed by water filtration to obtain a solution of phenol novolac epoxy resin.

To the resulting phenol novolac epoxy resin (solid contents: 100 parts by mass), 1000 ppm of methoquinone (hydroquinone monomethylether) and 2000 ppm of triphenylphosphine were added, and acrylic acid was added dropwise under a temperature of 100° C. so as to an acid value of the resulting resin became not greater than 1 mg KOH/g, to obtain a phenolic novolac epoxy acrylate (1).

The obtained phenolic novolac epoxy acrylate (1) had a weight average molecular weight of 950, a hydroxyl value of 140 mgKOH/g and a refractive index of 1.572.

Production Example 2

Production of a Phenolic Novolac Acrylate (2)

In a reaction vessel equipped with a stirrer, a thermometer, a dropping funnel and a reflux apparatus, 150 g of phenol novolac resin (a weight average molecular weight of 900 to 1100, an epoxy equivalent of 150 to 200) and 550 g of epichlorohydrin were mixed, and 110 g of an aqueous solution of sodium hydroxide (48.5%) was added dropwise for 2 hours under a temperature of 100° C. and a reduced pressure of 100 to 200 mmHg. After the reaction was finished, a reaction temperature of the reaction mixture was lowered to a room temperature, and excess amounts of an aqueous solution of sodium hydroxide were neutralized with an acid, then the reaction mixture was heated under a reduced pressure to remove excess amounts of epichlorohydrin.

Next, the resulting reaction mixture was dissolved in methyl isobutyl ketone, and a salt of byproduct was removed by water filtration to obtain a solution of phenol novolac epoxy resin.

To the resulting phenol novolac epoxy resin (solid contents: 100 parts by mass), 1000 ppm of methoquinone (hydroquinone monomethylether) and 2000 ppm of triphenylphosphine were added, and acrylic acid was added dropwise under a temperature of 100° C. so as to an acid value of the resulting resin became not greater than 1 mg KOH/g, to obtain a phenolic novolac epoxy acrylate (2).

The obtained phenolic novolac epoxy acrylate (2) had a weight average molecular weight of 1200, a hydroxyl value of 137 mgKOH/g and a refractive index of 1.571.

Example 1

A hard coating composition was prepared by using the phenolic novolac epoxy acrylate (1) obtained by Production example 1 as a component (A), an ethoxylated orthophenylphenol acrylate (an acrylate having 1 mol of ethylene oxide structure, a viscosity at 25° C. of 130 mPa·s and a refractive index of 1.577) as a component (B), a bisphenol A ethylene oxide (2 mols)-modified diacrylate as a component (C) and a pentaerythritol triacrylate as an another (meth)acrylate. Raw materials shown in Table 1 were mixed in the solid amounts shown in Table 1, and were stirred to obtain a hard coating composition.

A viscosity of the component (B), the ethoxylated orthophenylphenol acrylate, was measured at a number of rotations of 60 rpm by a B-type viscometer (TVB-22L, manufactured by Toki Sangyo co., ltd.) and a M1 Rotor, after 100 ml of the component (B), the ethoxylated orthophenylphenol acrylate, was sampled in a glass container as a test sample and was kept under a temperature of 20° C.

The refractive index of the component (B) was measured by an Abbe's refractometer in conformity with JIS (Japanese Industrial Standard) K0062.

In addition, the resulting hard coating composition was dropped on an optical PC film (trade name Pureace, manufactured by Teijin Limited, 100 μm) and was coated with a bar coater #9.

After the coating, the resulting coat was dried at 70° C. for one minute and was irradiated by ultraviolet rays of 350 mJ with a ultraviolet ray irradiator (manufactured by Fusion) to obtain a hard coat film composed of the polycarbonate film and a hard coat layer having a thickness of 5.0 μm.

Examples 2-13

A hard coating composition was prepared in the same manner as in Example 1 except that a component and amounts as the compound (A) was changed as shown in Table 1 or 2, and amounts of the components (B), (C) and another (meth)acrylate (a pentaerythritol triacrylate) were changed as shown in Table 1. Using the resulting hard coating composition, a hard coat layer was formed in the same manner as in Example 1.

Comparative Examples 1-11

A hard coating composition was prepared in the same manner as in Example 1 except that its content and composition ratio of a hard coating composition was changed as shown in Table 3. Using the resulting hard coating composition, a hard coat layer was formed in the same manner as in Example 1.

Example 14

Formation of Color Difference Adjusting Layer and Electrically Conducting Layer in Use of Hard Coating Compositions of Examples 1-13

A titanium oxide-containing dispersion (concentration of titanium oxide: 4 wt %) was obtained by adding isobutyl alcohol (i-BuOH) to a dispersion of ultrafine particles of titanium oxide (an average primary particle diameter: 30 nm) in n-butyl alcohol.

A solution of dipentaerythritol hexaacrylate in isobutyl alcohol (4 wt %) was prepared, which was a solution of UV curing resin component.

The titanium oxide-containing dispersion and the solution of UV curing resin component was added so as to obtain composition contents of titan oxide of 25 parts by mass and dipentaerythritol hexaacrylate of 75 parts by mass.

Next, a mixture ratio of the titanium oxide-containing dispersion and the solution of UV curing resin component was adjusted so as to minimize a difference ($\Delta R$) of R1 and R2, wherein R1 is a reflectance where a light source having a wavelength in a range of 500 to 750 nm was irradiated to an electroconductive laminate, and R2 is a reflectance where a light source having a wavelength in a range of 500 to 750 nm was irradiated to an electroconductive laminate after immersing into a strong acid aqueous solution obtained by a mixing of 12 N hydrochloric acid, 16 N nitric acid and water in a mass ratio of 12 N hydrochloric acid:16 N nitric acid:water being 3.3:1.0:7.6, at a temperature of 40° C. for three minutes and dried, to obtain a composition for a color difference adjusting layer. The composition for a color difference adjusting layer contained 40 parts of titanium oxide based on 100 parts by mass of a curing resin.

The resultant composition for a color difference adjusting layer was dropped on each of the hard coat films obtained by the Examples 1-13 and was coated in use of a bar coater #3.

After the coating, the resulting coat was dried at 70° C. for one minute and was irradiated by ultraviolet rays of 350 mJ with a ultraviolet ray irradiator (manufactured by Fusion) to obtain a color difference adjusting layer on the hard coat layer.

On the resulting color difference adjusting layer, an ITO layer was formed by a sputtering method in use of indium oxide-tin oxide target with a density of arrangement of 98% containing indium oxide and tin oxide with a mass ratio of 95:5, to obtain an amorphous ITO layer. A thickness of the resulting ITO layer was about 30 nm, and a surface electrical resistance after formation of the layer was about 150 Ω/square.

In case of applying a color adjusting layer on each of a hard coat films obtained by the Examples 11 and 12, a color adjusting layer was applied with a change of an amount of titanium oxide based on 100 parts by mass of a curing resin shown in the Table below.

Comparative Example 12

Formation of Color Difference Adjusting Layer and Electrically Conducting Layer in Use of Hard Coating Compositions of Comparative Examples 1-11

On each of the hard coat films obtained by the Comparative Examples 1-11, a color difference adjusting layer was formed in the same manner of Example 14.

On the resulting color difference adjusting layer, an ITO layer was formed by a sputtering method in use of indium oxide-tin oxide target with a density of arrangement of 98% containing indium oxide and tin oxide with a mass ratio of 95:5, to form an ITO layer, which obtained a transparent electroconductive laminate as a movable electrode base plate.

A thickness of the resulting ITO layer was about 30 nm, and a surface electrical resistance after formation of the layer was about 150 Ω/square.

Reference Example 1

A color difference adjusting layer was formed on the hard coat film obtained by the Example 11, in the same manner of Example 14 except that an amount of titanium oxide based on 100 parts by mass of a curing resin was changed to 300 parts by mass.

On the resulting color difference adjusting layer, an ITO layer was formed by a sputtering method in use of indium oxide-tin oxide target with a density of arrangement of 98% containing indium oxide and tin oxide with a mass ratio of 95:5, to form an ITO layer, which obtained a transparent electroconductive laminate as a movable electrode base plate.

A thickness of the resulting ITO layer was about 30 nm, and a surface electrical resistance after formation of the layer was about 150 Ω/square.

In use of hard coat films obtained by the Examples 1-13 and Comparative examples 1-11, and transparent electrically conducting layers obtained by the Example 14, Comparative example 12 and Reference example 1, the tests described below were examined. Obtained test results were shown in Tables 1-3.

Measurement of a Reflectance Difference $\Delta R$

A reflectance (R1) of the transparent electrically conducting layers obtained by the Examples and Comparative Examples were measured at an incident angle of 10 degrees with a spectrophotometer (U-3000, produced by Hitachi Ltd.) in conformity with JIS K5600-4-5.

A wavelength of the light source used in a measurement of the reflectance was in a range of 500 to 750 nm.

Then, the transparent electrically conducting layers obtained by the Examples and Comparative Examples were immersed into a strong acid aqueous solution obtained by a mixing of 12 N hydrochloric acid, 16 N nitric acid and water in a mass ratio of 12 N hydrochloric acid:16 N nitric acid:water being 3.3:1.0:7.6, at a temperature of 40° C. for three minutes and dried. To the treated transparent electrically conducting layers, a light source having a wavelength in a range of 500 to 750 nm was irradiated to measure a reflectance (R2). In the measurement, the reflectance (R1) means a reflectance where a transparent electrically conducting layer exists, as shown a part (13) in FIG. 1. The reflectance (R2) means a reflectance where a transparent electrically conducting layer does not exist, as shown a part (11) in FIG. 1.

A difference of R1 and R2 was referred to as $\Delta R$. A maximum $\Delta R$ value within a wavelength range of 500 nm to 700 nm was shown in Tables 1 and 2.

Evaluation Method of Interference Fringes

On a polycarbonate substrate, each of the hard coating compositions obtained by the Examples 1-13 and Comparative examples 1-11 was applied in use of bar coater, then, the resulting coat was dried at 70° C. for one minute and was irradiated by Fusion-H light source, to obtain a test sample for the above examples and comparative examples.

The resultant test sample was affixed on a black acrylic plate with the size of 100 mm by 100 mm in use of an adhesive for optical film use to appear a coat layer of the test sample on the surface.

A stand-type three-wavelength fluorescent light (SLH-399 model manufactured by Twinbird Corporation) was placed, and the test sample was placed perpendicularly below the fluorescent light in the distance between the light and the test sample being 10 cm, then the test sample was visually observed and evaluated under the following evaluation criteria. As for a test sample having good evaluation result (○), a visual observation under the sunlight was additionally performed.

○○: No interference fringes (interference pattern) are observed under either the three-wavelength fluorescent light or the sunlight.

○: No interference fringes (interference pattern) are observed under the three-wavelength fluorescent light, however a slight interference fringes are observed under the sunlight.

Δ: Slight interference fringes (interference pattern) are observed.

x: Interference fringes (interference pattern) are clearly observed.

Evaluation of Etching Mark

The resultant transparent electroconductive laminates obtained by the Example 14 and Comparative example 13 were immersed into a strong acid aqueous solution at 40° C. for three minutes for etching treatment, wherein the strong acid aqueous solution was obtained by a mixing of 12 N hydrochloric acid, 16 N nitric acid and water in a mass ratio of 12 N hydrochloric acid:16 N nitric acid:pure water being 3.3:1.0:7.6, to perform patterning. Using resultant samples with patterning, a stand-type three-wavelength fluorescent light (SLH-399 model manufactured by Twinbird Corporation) was placed, and the test sample was placed perpendicularly below the fluorescent light in the distance between the light and the test sample being 10 cm, then the test sample was visually observed and evaluated under the following evaluation criteria. As for a test sample having good evaluation result (○), a visual observation under the sunlight was additionally performed.

○○: Hardly differentiating between a patterned part and a non-patterned part under either the three-wavelength fluorescent light or the sunlight.

○: Slightly differentiating between a patterned part and a non-patterned part under the sunlight, however hardly differentiating between a patterned part and a non-patterned part under the three-wavelength fluorescent light.

Δ: Slightly differentiating between a patterned part and a non-patterned part under the three-wavelength fluorescent light.

x: Clearly differentiating between a patterned part and a non-patterned part under the three-wavelength fluorescent light.

Adhesion Evaluation 1 (Adhesion of Electroconductive Laminate)

The adhesion test was performed in accordance with JIS K5400. Each of the transparent electroconductive laminates obtained by the Example 14 and Comparative Example 13 was subjected to cross cutting so as to have 100 pieces of cut squares (grid pattern) with an area of 1 mm². Then, cellophane pressure-sensitive adhesive tape was completely stuck on the prepared grid pattern and one end of the tape was pulled upward and peeled off. This peeling operation was performed three times on the same part. Afterward, the number of squares from which a part of the laminate was peeled off was judged according to the following criteria. Evaluating result "8" and more described below were determined to be acceptable.

10: There is no square from which a part of the laminate was peeled off.

8: There are not more than 5 squares from which a part of the laminate was peeled off.

6: There are more than 5 and not more than 15 squares from which a part of the laminate was peeled off.

4: There are more than 15 and not more than 35 squares from which a part of the laminate was peeled off.

2: There are more than 35 and not more than 65 squares from which a part of the laminate was peeled off.

0: There are more than 65 and not more than 100 squares from which a part of the laminate was peeled off.

Adhesion Evaluation 2 (Adhesion of Hard Coat Film)

The hard coat films obtained by the Examples 1-13 and Comparative examples 1-11 were immersed into an ion exchanged water at 95-100° C. for 24 hours. After one hour had passed from immersion, cross cutting was subjected so as to have 100 pieces of cut squares (grid pattern) with an area of 1 mm². Then, a cellophane pressure-sensitive adhesive tape was completely stuck on the prepared grid pattern and one end of the tape was pulled upward and peeled off. This peeling operation was performed three times on the same part. Afterward, the number of squares from which a part of the laminate was peeled off was judged according to the above criteria with six-grade evaluation in the Adhesion evaluation 1.

Adhesion Evaluation 3 (Adhesion Toward Protection Film)

On a whole surface of a polycarbonate film with a dimension of 200×300 mm (trade name Pureace C110-100 TP, manufactured by Teijin Limited), a protection film was adhered in use of an automatic adhesion machine HAL-650S, manufactured by Sankyo co., ltd., with a pressure of 50 kgf per square meter and at an adhesion speed of 30 cm per second. The resultant adhesive protection film with an adhesive force of 10 to 12 gf/25 mm was adhered on each of transparent electroconductive laminate with a dimension of 200×300 mm obtained by the Example 14, Comparative example 12 and reference example 1 in the above conditions, then was left in that state for 24 hours. The protection film was peeled from the end part, and was judged according to the following criteria.

○: Only the adhesive protection film was peeled.

x: An electrically conducting layer, a color difference adjusting layer or a hard coat layer was stuck to the adhesive protection film.

Contact Angle for a Polycarbonate Substrate

A test solution was prepared by mixing 85 parts by mass of resin components used in preparation of hard coating compositions of the Examples 1-13 and Comparative examples 1-11, and 15 parts by mass of methyl isobutyl ketone. The resultant test solution was dropped on a polycarbonate substrate as a drop of 1.77 μl. Next, a contact angle of the substrate and the drop was measured in use of a measuring device KRUSSDSA 20 available by Sanyo trading co., ltd.

TABLE 1

|  |  | Examples | | | | | | |
|---|---|---|---|---|---|---|---|---|
|  |  | 1 | 2 | 3 | 4 | 5 | 6 | 7 |
| Hard coat layer | Phenolic novolac epoxy acrylate (1) | 40.00 | 50.00 | 40.00 | 40.00 | 50.00 | 50.00 | 40.00 |
|  | Phenolic novolac epoxy acrylate (2) |  |  |  |  |  |  |  |
|  | Ethoxylated orthophenyl phenol acrylate | 25.00 | 25.00 | 35.00 | 25.00 | 35.00 | 25.00 | 35.00 |
|  | Bisphenol A EO-modified (2 mol) diacrylate | 10.00 | 10.00 | 10.00 | 20.00 | 10.00 | 20.00 | 20.00 |
|  | Pentaerythritol triacrylate | 25.00 | 15.00 | 15.00 | 15.00 | 5.00 | 5.00 | 5.00 |
|  | Bifunctional urethane acrylate(CN-9893) |  |  |  |  |  |  |  |
|  | High refractive index filler (zirconia: ZRMIBK30WT %) |  |  |  |  |  |  |  |
|  | Irgacure 184 | 5.00 | 5.00 | 5.00 | 5.00 | 5.00 | 5.00 | 5.00 |
|  | Methyl isobutyl ketone | 10.00 | 12.50 | 10.00 | 10.00 | 12.50 | 12.50 | 10.00 |
|  | Isobutyl alcohol | 78.75 | 78.75 | 78.75 | 78.75 | 78.75 | 78.75 | 78.75 |
|  | Butyl acetate | 68.75 | 66.25 | 68.75 | 68.75 | 66.25 | 66.25 | 68.75 |
|  | Total amounts | 262.50 | 262.50 | 262.50 | 262.50 | 262.50 | 262.50 | 262.50 |
|  | Refractive index of hard coat layer | 1.561 | 1.567 | 1.567 | 1.563 | 1.573 | 1.569 | 1.569 |
|  | Layer thickness (μm) | 3 | 3 | 3 | 3 | 3 | 3 | 3 |
| Color difference adjusting layer (Ex 14) | An amount of ultrafine particles (parts by mass) | 40 | 40 | 40 | 40 | 40 | 40 | 40 |
| Evaluation | ΔMax |R1-R2| (%) (500-750) | 0.72 | 0.54 | 0.56 | 0.67 | 0.52 | 0.55 | 0.60 |
|  | Interference fringes (visual appearance evaluation) | ○ | ○○ | ○○ | ○ | ○○ | ○○ | ○○ |
|  | Eching mark (visual evaluation) | ○ | ○○ | ○○ | ○ | ○○ | ○○ | ○○ |
|  | Adhesion evaluation 1 | 10 | 10 | 10 | 10 | 10 | 10 | 10 |
|  | Adhesion evaluation 2 | 10 | 10 | 10 | 10 | 10 | 10 | 10 |
|  | Adhesion evaluation 3 | ○ | ○ | ○ | ○ | ○ | ○ | ○ |
| Contact angle for a polycarbonate substrate |  | 23° | 25° | 23° | 23° | 25° | 25° | 21° |

TABLE 2

|  |  | Example | | | | | |
|---|---|---|---|---|---|---|---|
|  |  | 8 | 9 | 10 | 11 | 12 | 13 |
| Hard coat layer | Phenolic novolac epoxy acrylate (1) | 48.00 | 45.00 | 45.00 | 45.00 | 45.00 |  |
|  | Phenolic novolac epoxy acrylate (2) |  |  |  |  |  | 45.00 |
|  | Ethoxylated orthophenyl phenol acrylate | 33.00 | 30.00 | 30.00 | 30.00 | 30.00 | 30.00 |
|  | Bisphenol A EO-modified (2 mol) diacrylate | 19.00 | 15.00 | 15.00 | 15.00 | 15.00 | 15.00 |
|  | Pentaerythritol triacrylate |  | 10.00 | 10.00 | 10.00 | 10.00 | 10.00 |
|  | Bifunctional urethane acrylate(CN-9893) |  |  |  |  |  |  |
|  | High refractive index filler (zirconia: ZRMIBK30WT %) |  |  |  |  |  |  |
|  | Irgacure 184 | 5.00 | 5.00 | 5.00 | 5.00 | 5.00 | 5.00 |
|  | Methyl isobutyl ketone | 12.00 | 11.25 | 11.25 | 11.25 | 11.25 | 11.25 |
|  | Isobutyl alcohol | 78.75 | 78.75 | 78.75 | 78.75 | 78.75 | 78.75 |
|  | Butyl acetate | 66.75 | 67.50 | 67.50 | 67.50 | 67.50 | 67.50 |
|  | Total amounts | 262.50 | 262.50 | 262.50 | 262.50 | 262.50 | 262.50 |
|  | Refractive index of hard coat layer | 1.572 | 1.568 | 1.568 | 1.568 | 1.568 | 1.568 |
|  | Layer thickness (μm) | 3 | 3 | 5 | 3 | 3 | 3 |
| Color difference adjusting layer (Ex 14) | An amount of ultrafine particles (parts by mass) | 40 | 40 | 40 | 10 | 200 | 40 |
| Evaluation | ΔMax |R1-R2| (%) (500-750) | 0.51 | 0.58 | 0.61 | 0.89 | 0.95 | 0.55 |
|  | Interference fringes (visual appearance evaluation) | ○○ | ○○ | ○○ | ○○ | ○○ | ○○ |
|  | Eching mark (visual evaluation) | ○○ | ○○ | ○○ | Δ | Δ | ○○ |
|  | Adhesion evaluation 1 | 10 | 10 | 10 | 10 | 8 | 10 |
|  | Adhesion evaluation 2 | 10 | 10 | 10 | 10 | 8 | 10 |
|  | Adhesion evaluation 3 | ○ | ○ | ○ | ○ | ○ | ○ |
| Contact angle for a polycarbonate substrate |  | 24° | 23° | 23° | 25° | 24° | 23° |

TABLE 3

|  |  | Comparative examples | | | | | |
| --- | --- | --- | --- | --- | --- | --- | --- |
|  |  | 1 | 2 | 3 | 4 | 5 | 6 |
| Hard coat layer | Phenolic novolac epoxy acrylate (1) |  | 20.00 | 65.00 | 72.5 | 40.00 | 40.00 |
|  | Phenolic novolac epoxy acrylate (2) |  |  |  |  |  |  |
|  | Ethoxylated orthophenyl phenol acylate |  | 25.00 | 25.00 | 22.5 | 15.00 | 40.00 |
|  | Bisphenol A EO-modified (2 mol) diacrylate |  | 10.00 | 10.00 |  | 10.00 | 10.00 |
|  | Pentaerythritol triacrylate | 100.00 | 45.00 |  |  | 5.00 | 35.00 | 10.00 |
|  | Bifunctional urethane acrylate(CN-9893) |  |  |  |  |  |  |
|  | High refractive index filler (zirconia: ZRMIBK30WT %) |  |  |  |  |  |  |
|  | Irgacure 184 | 5.00 | 5.00 | 5.00 | 5.00 | 5.00 | 5.00 |
|  | Methyl isobutyl ketone |  | 5.00 | 16.25 | 18.13 | 10.00 | 10.00 |
|  | Isobutyl alcohol | 78.75 | 78.75 | 78.75 | 55.10 | 78.75 | 78.75 |
|  | Butyl acetate | 78.75 | 73.75 | 62.50 | 55.10 | 68.75 | 68.75 |
|  | Total amounts | 262.50 | 262.50 | 262.50 | 233.33 | 262.50 | 262.50 |
|  | Refractive index of hard coat layer | 1.520 | 1.549 | 1.575 | 1.582 | 1.555 | 1.570 |
|  | Layer thickness (μm) | 3 | 3 | 3 | 3 | 3 | 3 |
| Color difference adjusting layer (Ex 14) | An amount of ultrafine particles (parts by mass) | 40 | 40 | 40 | 40 | 40 | 40 |
| Evaluation | ΔMax |R1-R2| (%) (500-750) | 2.24 | 1.54 | 0.54 | 0.65 | 1.25 | 0.64 |
|  | Interference fringes (visual appearance evaluation) | x | x | ○○ | ○○ | Δ | ○○ |
|  | Eching mark (visual evaluation) | x | x | ○○ | ○○ | Δ | ○○ |
|  | Adhesion evaluation 1 | 10 | 10 | 10 | 10 | 10 | 10 |
|  | Adhesion evaluation 2 | 10 | 10 | 8 | 10 | 8 | 4 |
|  | Adhesion evaluation 3 | ○ | ○ | x | x | x | ○ |
| Contact angle for a polycarbonate substrate |  | 23° | 23° | 34° | 36° | 28° | 22° |

|  |  | Comparative examples | | | | | Reference example 1 |
| --- | --- | --- | --- | --- | --- | --- | --- |
|  |  | 7 | 8 | 9 | 10 | 11 | |
| Hard coat layer | Phenolic novolac epoxy acrylate (1) | 40.00 | 40.00 |  |  |  | 45.00 |
|  | Phenolic novolac epoxy acrylate (2) |  |  |  |  |  |  |
|  | Ethoxylated orthophenyl phenol acylate | 25.00 | 25.00 |  |  |  | 30.00 |
|  | Bisphenol A EO-modified (2 mol) diacrylate |  | 35.00 |  |  |  | 15.00 |
|  | Pentaerythritol triacrylate | 35.00 |  | 70.00 | 40.00 | 28.00 | 10.00 |
|  | Bifunctional urethane acrylate(CN-9893) |  |  |  | 60.00 | 42.00 |  |
|  | High refractive index filler (zirconia: ZRMIBK30WT %) |  |  | 30.00 |  | 30.00 |  |
|  | Irgacure 184 | 5.00 | 5.00 | 5.00 | 5.00 | 5.00 | 5.00 |
|  | Methyl isobutyl ketone | 10.00 | 10.00 | 70.00 |  | 70.00 | 11.25 |
|  | Isobutyl alcohol | 78.75 | 78.75 | 78.75 | 78.75 | 78.75 | 78.75 |
|  | Butyl acetate | 68.75 | 68.75 | 8.75 | 78.75 | 8.75 | 67.50 |
|  | Total amounts | 262.50 | 262.50 | 262.50 | 262.50 | 262.50 | 262.50 |
|  | Refractive index of hard coat layer | 1.558 | 1.567 | 1.570 | 1.510 | 1.569 | 1.568 |
|  | Layer thickness (μm) | 3 | 3 | 3 | 3 | 3 | 3 |
| Color difference adjusting layer (Ex 14) | An amount of ultrafine particles (parts by mass) | 40 | 40 | 40 | 40 | 40 | 300 |
| Evaluation | ΔMax |R1-R2| (%) (500-750) | 0.95 | 0.75 | 2.35 | 2.41 | 2.47 | 1.41 |
|  | Interference fringes (visual appearance evaluation) | Δ | ○ | x | x | x | ○ |
|  | Eching mark (visual evaluation) | Δ | Δ | x | x | x | Δ |
|  | Adhesion evaluation 1 | 10 | 10 | 10 | 10 | 10 | 4 |
|  | Adhesion evaluation 2 | 4 | 4 | 10 | 10 | 10 | 4 |
|  | Adhesion evaluation 3 | ○ | ○ | ○ | ○ | ○ | x |
| Contact angle for a polycarbonate substrate |  | 28° | 24° | 23° | 28° | 29° | 23° |

In the Tables 1-3, each term means as follows.

I-184:1-hydroxycyclohexyl phenyl ketone, a photoinitiator.

Ethoxylated orthophenyl phenol acrylate: Aronix M-106 manufactured by Toa gosei Co., Ltd.

Bisphenol A EO-modified (2 mol) diacrylate: Aronix M-211B manufactured by Toa gosei Co., Ltd., bisphenol A ethyleneoxide-modified (2 mol) diacrylate having 4 mols of ethylene oxide structure in the molecule.

High refractive index filler 1: zirconia: ZRMIBK30 WT %, zirconium oxide, manufactured by CIK NanoTec.

Bifunctional urethane acrylate: NV (non-volatile component) 100, CN-9893 manufactured by Sartomer Corp.

Each of the hard coat films having the hard coat layer obtained by applying the hard coating composition of Examples 1-13 had high refractive index and excellent hardness without interference fringes. In addition, the resultant hard coat films had excellent elongation and bending resistance, furthermore, had no problem about initial adhesion properties and severe adhesion evaluations such as peeling test after lamination of protection film and an adhesion evaluation after 24-hour immersion of boiling water.

Comparative example 1 was a comparative example in which conventional hard coat layer was formed. In the Comparative example 1, interference fringes were observed derived from low refractive index.

Comparative examples 2 and 3 were a comparative example in which an amount of the component (A) was out of the scope of claimed invention of the present application. When the amount was less than the range of the claimed invention, refractive index lowered and defects of interference fringes occurred. In the comparative example, when the amount was more than the range of the claimed invention, defects of inferior adhesion property occurred. Comparative example 3 included excess amount of component (A), which provided inferior adhesion property between a hard coat layer and a polycarbonate substrate.

Comparative example 4 was a comparative example corresponding to an example of former patent application No. JP 2012-079755. In the comparative example, a hard coat layer was adhered to an electroconductive laminate, and any one of an electrically conducting layer, a color difference adjusting layer and a hard coat layer was stuck to the adhesive protection film.

Comparative examples 5 and 6 were a comparative example in which an amount of the component (B) was out of the scope of claimed invention of the present application. In the comparative examples, when the amount was less than the range of the claimed invention, refractive index lowered and defects of interference fringes occurred. When the amount was more than the range of the claimed invention, defects of inferior hardness and adhesion property occurred. Comparative example 5 included less amount of component (B), which provided inferior adhesion property between a hard coat layer and a polycarbonate substrate.

Comparative examples 7 and 8 were a comparative example in which an amount of the component (C) was out of the scope of claimed invention of the present application. In the comparative examples, when the amount was less than the range of the claimed invention, refractive index lowered and defects of interference fringes occurred. When the amount was more than the range of the claimed invention, defects of inferior hardness occurred.

Comparative example 9 was a comparative example in which zirconium oxide was used as a high refractive index material, in place of using the components (A) and (B). In the comparative example, sufficient hardness was obtained; however, significant inferior elongation was obtained. In addition, appearance of interference fringes could not be prevented in spite of higher refractive index. Furthermore, inferior adhesion property between a hard coat layer and a polycarbonate substrate was obtained.

Comparative examples 10 to 11 were comparative examples in which a bifunctional urethane acrylate was used in order to provide an elongation to a hard coat layer. These comparative examples had a slightly-increased elongation. However, sufficient elongation could not be obtained. In addition, appearance of interference fringes could not be prevented.

The hard coating compositions of Comparative examples 9 and 11 included high refractive index fillers. Including high refractive index fillers provided indeed a high refractive index of the obtaining hard coat layer. On the other hand, each the obtaining hard coat layer of the comparative examples was observed appearance of interference fringes.

The reason why the comparative examples had appearance of interference fringes seems to be a mixture of resin components having lower refractive indexes which form an hard coat layer and high refractive index fillers which exist between the resin components. The constitution seems to provide inferior prevention of appearance of interference fringes because of a bad influence of the resin components' lower refractive indexes, even if a refractive index itself of a hard coat layer is high.

Reference example 1 was an example in which a total mass of particles (ii) and (iii) in the color difference adjusting layer was more than 200 parts by mass with respect to 100 parts by mass of the curing resin component (i). In the example, adhesion toward a protection film lowered.

As shown in the above examples and comparative examples, it is clear that the hard coat layer according to the present invention achieves excellent inhibitory effects of interference fringes.

Figure 2:
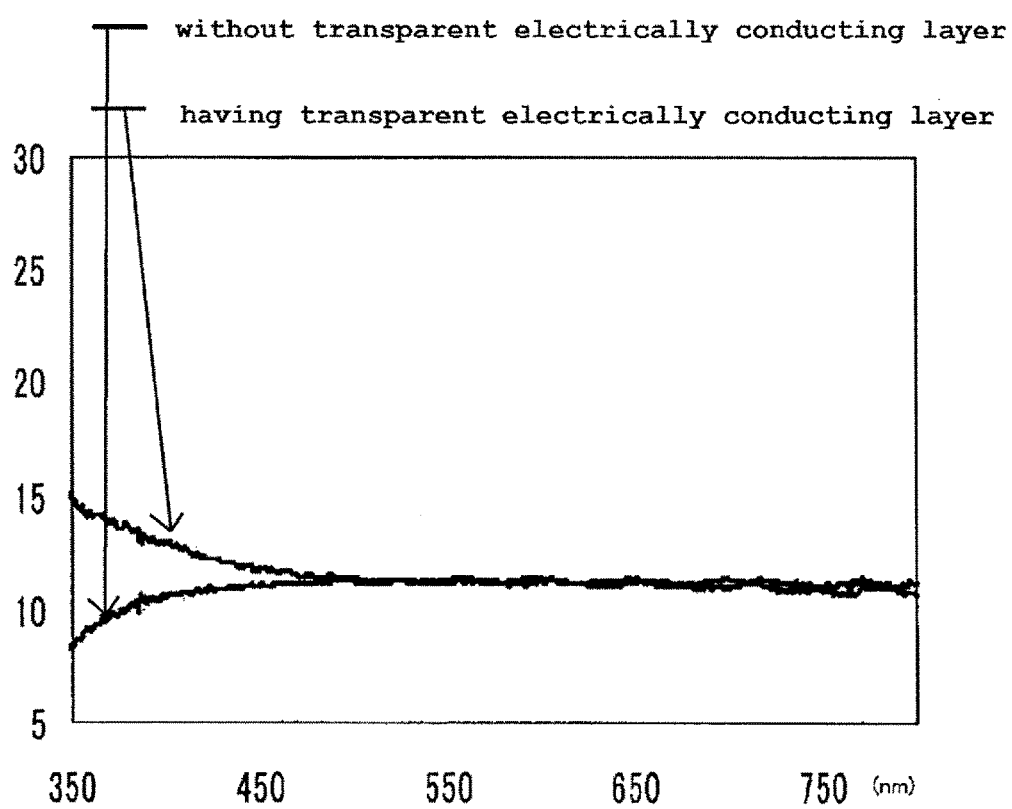
FIG. 2 is a graphical chart showing a transmission spectra (transmittance (%)) of a hard coat layer in Example 9 in a wavelength range of 400 nm to 800 nm.

FIG. 2 is a graphical chart showing a transmission spectra (transmittance (%)) of a hard coat layer in Example 9 in a wavelength range of 400 nm to 800 nm.

Figure 3:
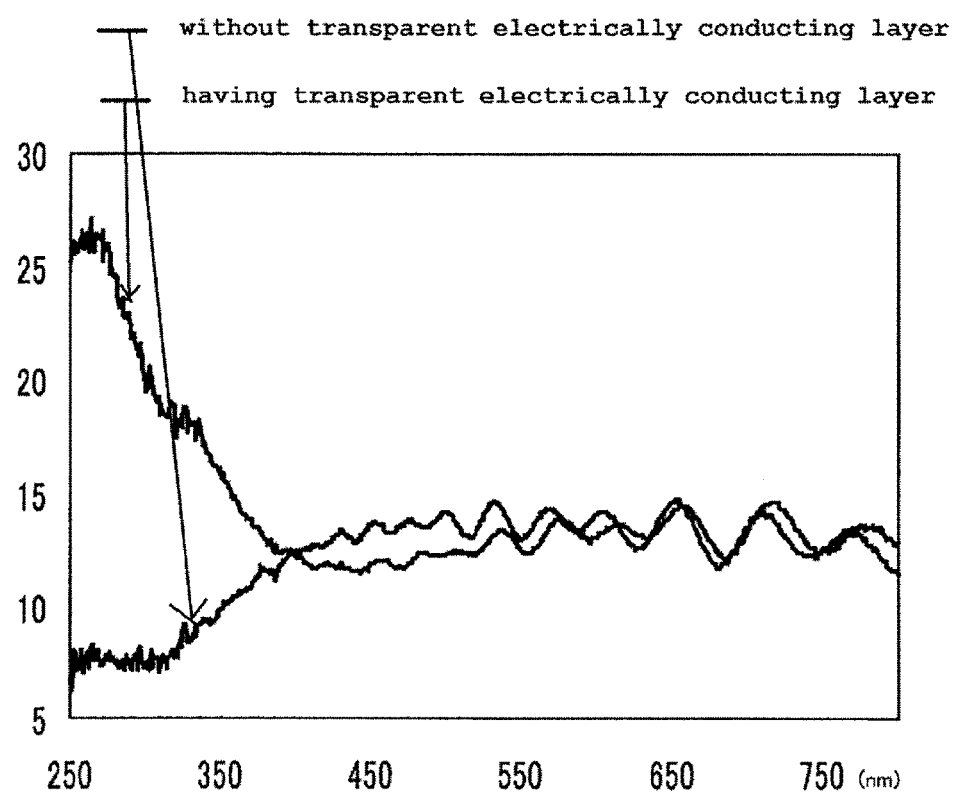
FIG. 3 is a graphical chart showing a transmission spectra (transmittance (%)) of a hard coat layer in Comparative example 1 in a wavelength range of 400 nm to 800 nm.

FIG. 3 is a graphical chart showing a transmission spectra (transmittance (%)) of a hard coat layer in Comparative example 1 in a wavelength range of 400 nm to 800 nm. As shown the transmission spectra in FIG. 2 and FIG. 3, can be seen that the hard coat layer obtained by the hard coating composition according to the present invention includes very small scale of amplitude in the transmission spectra, which provides little optical shake in the range of visible wavelength. On the other hand, it can be seen that the hard coat layer obtained by the hard coating composition of Comparative example 1 includes large scale of amplitude in the transmission spectra, which provides large optical shake in the range of visible wavelength. These experimental data of the transmission spectra help understanding of technical effects of the present invention.

INDUSTRIAL APPLICABILITY

The present invention provides a hard coat layer having stretchability and excellent adhesion property toward a polycarbonate substrate, as well as high visibility and excellent hardness. The transparent hard coat layer obtainable by the hard coating composition according to the present invention has features of high refractive index. Therefore, the present invention has advantageousness such as excellent stretchability without interference fringes in case that the hard coat layer according to the present invention is applied onto a high refractive index substrate film such as a polycarbonate film. In addition, the present invention also includes excellent adhesion properties, which provides advantageousness of reducing problems at the time of laminating a film such as a protection film.

Description of the Reference Numerals

1: a polycarbonate substrate,
3: a hard coat layer,
5: a color difference adjusting layer,
7: an electrically conducting layer,
10: an electroconductive laminate,
11: a part where a reflectance R2 shows, and
13: a part where a reflectance R1 shows.

What is claimed is:

1. An electroconductive laminate in which a hard coat layer and an electrically conducting layer are formed on at least one surface of a polycarbonate substrate, wherein
the hard coat layer is obtained by a hard coating composition comprising
(A) a phenolic novolac acrylate having two or more acrylate groups,
(B) an orthophenyl phenol acrylate having 1 or 2 mols of an ethylene oxide structure in each molecule, and (C) a bisphenol structure-containing diacrylate having 2 to 4 moles of alkylene oxide structure with two or three carbon atoms in each molecule, wherein
the hard coating composition comprises
40 to 50 parts by mass of the phenolic novolac acrylate (A),
25 to 35 parts by mass of the orthophenyl phenol acrylate (B), and
10 to 20 parts by mass of the diacrylate (C), with respect to 100 parts by mass of a resin content in the hard coating composition.

2. The electroconductive laminate according to claim 1, wherein the phenolic novolac acrylate (A) is represented by the following formula (I):

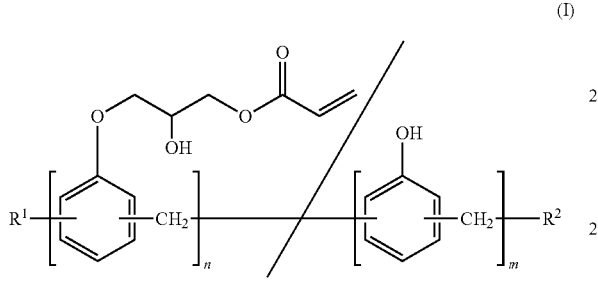

(I)

wherein $R^1$ represents H or $CH_2OH$, $R^2$ represents H or OH, n represents a number of 2 to 5 and m represents a number of 0 to 5.

3. The electroconductive laminate according to claim 1, wherein the hard coat layer has a refractive index within a range of 1.565 to 1.575.

4. The electroconductive laminate according to claim 1, wherein a total content of ZnO, $TiO_2$, $CeO_2$, $SnO_2$, $ZrO_2$ and indium tin oxide in the hard coat layer is less than or equal to 0.0001% by mass.

5. The electroconductive laminate according to claim 1, wherein
the electrically conducting layer has a thickness within a range of 5 to 100 nm.

6. The electroconductive laminate according to claim 1, wherein an auxiliary electrode layer is formed on the electrically conducting layer,
wherein a total thickness of the electrically conducting layer and the auxiliary electrode layer is within a range of 20 to 500 nm.

7. The electroconductive laminate according to claim 1, wherein an antiblocking layer is formed on the other side of the hard coat layer side of the polycarbonate substrate, wherein
the antiblocking layer is obtained by a composition for forming an antiblocking layer comprising a first component and a second component, wherein the first component is an unsaturated double bond containing acrylic copolymer, and
the second component comprises a polyfunctional acrylate, and
a difference of SP values (ΔSP) of the first component (SP1) and the second component (SP2) is within a range of 1 to 2, and
phase separation occurs between the first component and the second component after the composition for forming an antiblocking layer is applied, to form an antiblocking layer having a microscopic convexoconcave on its surface.

8. A touch panel having the electroconductive laminate according to claim 1.

9. An electroconductive laminate in which a hard coat layer, a color difference adjusting layer, and an electrically conducting layer are formed on at least one surface of a polycarbonate substrate, wherein
the hard coat layer is obtained by a hard coating composition comprising
(A) a phenolic novolac acrylate having two or more acrylate groups,
(B) an orthophenyl phenol acrylate having 1 or 2 mols of an ethylene oxide structure in each molecule, and
(C) a bisphenol structure-containing diacrylate having 2 to 4 moles of alkylene oxide structure with two or three carbon atoms in each molecule, wherein
the hard coating composition comprises
40 to 50 parts by mass of the phenolic novolac acrylate (A),
25 to 35 parts by mass of the orthophenyl phenol acrylate (B), and
10 to 20 parts by mass of the diacrylate (C), with respect to 100 parts by mass of a resin content in the hard coating composition, and wherein
the color difference adjusting layer is obtained by a composition comprising a curing resin component (i), and metal oxide particles having an average primary particle diameter of 100 nm or less (ii) and/or metal fluoride particles having an average primary particle diameter of 100 nm or less (iii), and
where a total mass of the particles (ii) and (iii) in the color difference adjusting layer is 0-200 parts by mass with respect to 100 parts by mass of the curing resin component (i), and wherein
a difference ΔR of R1 and R2 is not greater than 1, wherein R1 is a reflectance obtained by irradiation with a light source having a wavelength in a range of 500 to 750 nm toward the transparent electroconductive laminate, and R2 is a reflectance obtained by irradiation with a light source having a wavelength in a range of 500 to 750 nm toward a transparent electroconductive laminate after immersion into a strong acid aqueous solution at 40° C. for three minutes and dried, wherein the strong acid aqueous solution is obtained by a mixing of 12 N hydrochloric acid, 16 N nitric acid and water in a mass ratio of 12 N hydrochloric acid : 16 N nitric acid : water being 3.3:1.0:7.6.

10. The electroconductive laminate according to claim 9, wherein an auxiliary electrode layer is formed on the electrically conducting layer, wherein a total thickness of the electrically conducting layer and the auxiliary electrode layer is within a range of 20 to 500 nm.

11. The electroconductive laminate according to claim 9, wherein an antiblocking layer is formed on the other side of the hard coat layer side of the polycarbonate substrate, wherein
the antiblocking layer is obtained by a composition for forming an antiblocking layer comprising a first component and a second component, wherein the first component is an unsaturated double bond containing acrylic copolymer, and
the second component comprises a polyfunctional acrylate, and
a difference of SP values (ΔSP) of the first component (SP1) and the second component (SP2) is within a range of 1 to 2, and
phase separation occurs between the first component and the second component after the composition for forming an antiblocking layer is applied, to form an antiblocking layer having a microscopic convexoconcave on its surface.

12. A touch panel having the electroconductive laminate according to claim 9.

* * * * *

UNITED STATES PATENT AND TRADEMARK OFFICE
CERTIFICATE OF CORRECTION

PATENT NO. : 9,639,227 B2  
APPLICATION NO. : 15/023432  
DATED : May 2, 2017  
INVENTOR(S) : Kazuhito Kobayashi Page 1 of 1

It is certified that error appears in the above-identified patent and that said Letters Patent is hereby corrected as shown below:

On the Title Page

Item [73], change "NIPPON AUTOMOTIVE COATINGS CO., LTD., Osaka, (JP)" to --NIPPON PAINT AUTOMOTIVE COATINGS CO., LTD., Osaka, (JP)--.

Signed and Sealed this  
Twentieth Day of August, 2019

Andrei Iancu  
*Director of the United States Patent and Trademark Office*